US009260348B2

(12) United States Patent
Ueda et al.

(10) Patent No.: US 9,260,348 B2
(45) Date of Patent: Feb. 16, 2016

(54) PIEZOELECTRIC MATERIAL, PIEZOELECTRIC ELEMENT, AND ELECTRONIC EQUIPMENT

(71) Applicant: CANON KABUSHIKI KAISHA, Tokyo (JP)

(72) Inventors: Miki Ueda, Tokyo (JP); Takayuki Watanabe, Yokohama (JP); Shunsuke Murakami, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/764,030

(22) PCT Filed: Jan. 24, 2014

(86) PCT No.: PCT/JP2014/052185
§ 371 (c)(1),
(2) Date: Jul. 28, 2015

(87) PCT Pub. No.: WO2014/119702
PCT Pub. Date: Aug. 7, 2014

(65) Prior Publication Data
US 2015/0353431 A1 Dec. 10, 2015

(30) Foreign Application Priority Data
Jan. 29, 2013 (JP) ................. 2013-014614

(51) Int. Cl.
B41J 2/045 (2006.01)
C04B 35/495 (2006.01)
(Continued)

(52) U.S. Cl.
CPC ................. *C04B 35/495* (2013.01); *B06B 1/06* (2013.01); *B41J 2/14201* (2013.01);
(Continued)

(58) Field of Classification Search
CPC ........ B41J 2/161; B41J 2/1628; B41J 2/1632; B41J 2/1646; B41J 2/1623; B41J 2/1629; B41J 2/1642; B41J 2/1645; B41J 2/14233; B41J 2/14201; B41J 2202/14419; B41J 2202/14241; B41J 2202/03
See application file for complete search history.

(56) References Cited

U.S. PATENT DOCUMENTS 7,521,845 B2 * 4/2009 Ifuku ................... B41J 2/14233
252/62.9 PZ
7,999,441 B2 * 8/2011 Aoki ................... B41J 2/14233
310/328
2008/0252179 A1 10/2008 Kimura

FOREIGN PATENT DOCUMENTS

EP 1876156 A1 1/2008
JP 2008-156172 A 7/2008
(Continued)

OTHER PUBLICATIONS

Zeng et al., "Ferroelectric and Piezoelectric Properties of Na1—xBaxNb1—xTixO3 Ceramics", Journal of the American Ceramic Society, 2006, vol. 89, pp. 2828 to 2832.
(Continued)

Primary Examiner — Juanita D Jackson
(74) Attorney, Agent, or Firm — Canon U.S.A. Inc., IP Division

(57) ABSTRACT

There is provided a lead- and potassium-free piezoelectric material having a high piezoelectric constant and a satisfactory insulation property and a piezoelectric element that includes the piezoelectric material. The piezoelectric material contains a perovskite-type metal oxide having the general formula (1): $(Na_xBa_{1-y})(Nb_yTi_{1-y})O_3$ (wherein x satisfies $0.80 \leq x \leq 0.95$, and y satisfies $0.85 \leq y \leq 0.95$) and Zn, wherein the Zn content corresponds to more than 0 mol % or less of the amount of perovskite-type metal oxide. The piezoelectric element includes the piezoelectric material.

23 Claims, 15 Drawing Sheets

(51) Int. Cl.
- *H01L 41/18* (2006.01)
- *H01L 41/083* (2006.01)
- *B41J 2/14* (2006.01)
- *H02N 2/00* (2006.01)
- *G02B 7/04* (2006.01)
- *G02B 27/00* (2006.01)
- *B06B 1/06* (2006.01)
- *H04N 5/217* (2011.01)
- *H04N 5/225* (2006.01)

(52) U.S. Cl.
CPC .............. *B41J 2/14233* (2013.01); *G02B 7/04* (2013.01); *G02B 27/0006* (2013.01); *H01L 41/083* (2013.01); *H01L 41/18* (2013.01); *H02N 2/001* (2013.01); *H04N 5/2171* (2013.01); *H04N 5/2254* (2013.01)

(56) References Cited

FOREIGN PATENT DOCUMENTS

| | | |
|---|---|---|
| JP | 2009-227535 A | 10/2009 |
| WO | 2012/118213 A1 | 9/2012 |
| WO | 2013/005701 A1 | 1/2013 |

OTHER PUBLICATIONS

Seo et al., "Piezoelectric properties of CuO-added (Na0.5K0.5)NbO3 ceramic multilayers", SciVerse ScienceDirect, vol. 32, No. 5, pp. 1085-1019, 2012.

Adachi et al., "Piezoelectric Properties of Modified (K0.5Na0.5)NbO3—BaTiO3 Ceramics with the Mixture Sintering Aids of 0.6B2O3-0.4CuO", Aug. 9, 2010 IEEE, pp. 1-4.

Park et al., "low-Temperature Sintering and Piezoelectric Properties of (Na0.5K0.5)NbO3 lead-free Piezoelectric Ceramics", J. Am. Ceram. Soc., vol. 93, No. 1, Jan. 1, 2010, pp. 36-39.

* cited by examiner

PIEZOELECTRIC MATERIAL, PIEZOELECTRIC ELEMENT, AND ELECTRONIC EQUIPMENT

TECHNICAL FIELD

The present invention relates to a piezoelectric material and more particularly to a lead-free piezoelectric material. The present invention also relates to a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

BACKGROUND ART

Lead zirconate titanate is a typical piezoelectric material and is used in various piezoelectric devices, such as actuators, oscillators, sensors, and filters. When lead-containing piezoelectric devices are scrapped and exposed to acid rain, however, lead components may leach from the piezoelectric materials into the ground and destroy an ecosystem. Thus, lead-free piezoelectric materials for lead-free piezoelectric devices are being actively studied and developed.

Existing typical widely-studied lead-free piezoelectric materials are piezoelectric materials containing potassium niobate. In the synthesis of potassium-containing piezoelectric materials, however, it is difficult to accurately weigh their raw material (for example, potassium carbonate) powders at an intended molar ratio because of their high hygroscopicity. Furthermore, the piezoelectricity of piezoelectric ceramics containing potassium niobate ($KNbO_3$) sometimes deteriorates over time because piezoelectric materials containing potassium niobate are deliquescent. In addition, the successive phase transition temperature between tetragonal crystals and orthorhombic crystals of piezoelectric materials containing potassium niobate is in an operating temperature range of piezoelectric devices (for example, in the range of 0° C. to 80° C.). Since piezoelectricity varies significantly in the neighborhood of the successive phase transition temperature, the performance of such piezoelectric devices depends greatly on the operating temperature.

NPL 1 described a solid solution (hereinafter referred to as NN-BT) of an antiferroelectric material sodium niobate ($NaNbO_3$) and barium titanate ($BaTiO_3$) as a lead- and potassium-free piezoelectric material. It is disclosed that a piezoelectric ceramic containing sodium niobate and barium titanate at a ratio of 9:1 had a piezoelectric constant $d_{33}$ of 147 pC/N.

PTL 1 discloses a niobate piezoelectric ceramic containing NN-BT to which cobalt oxide (CoO) is added. The niobate piezoelectric ceramic has a high electromechanical coupling coefficient and high heat resistance. However, some samples were difficult to polarize because of a low resistance as low as $10^6 \Omega$ or less.

PTL 2 discloses a method for manufacturing a niobate piezoelectric ceramic having a high Curie temperature and a satisfactory piezoelectric property. It is disclosed that a niobate piezoelectric ceramic containing a solid solution of NN-BT and strontium titanate ($SrTiO_3$) had a piezoelectric constant $d_{33}$ in the range of 14 to 126 pm/V.

CITATION LIST

Patent Literature

PTL 1 Japanese Patent Laid-Open No. 2009-227535
PTL 2 Japanese Patent Laid-Open No. 2008-156172

Non Patent Literature

NPL 1 J. T. Zeng et al., Journal of the American Ceramic Society, 2006, vol. 89, pp. 2828-2832

SUMMARY OF INVENTION

Technical Problem

Known NN-BTs have insufficient piezoelectric performance.

The present invention solves such problems and provides a lead- and potassium-free piezoelectric material having a high piezoelectric constant and a satisfactory insulation property. The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

Solution to Problem

A piezoelectric material according to the present invention that solves the problems described above a perovskite-type metal oxide having the following general formula (1) and Zn, wherein the Zn content corresponds to more than 0 mol % and 5 mol % or less of the amount of the perovskite-type metal oxide:

$$(Na_xBa_{1-x})(Nb_yTi_{1-y})O_3 \tag{1}$$

wherein x satisfies $0.80 \le x \le 0.95$, and y satisfies $0.85 \le y \le 0.95$.

A piezoelectric element according to one aspect of the present invention includes a first electrode, a piezoelectric material portion, and a second electrode, wherein the piezoelectric material portion includes the piezoelectric material described above.

A multilayered piezoelectric element according to one aspect of the present invention includes piezoelectric material layers and electrode layers alternately stacked on top of one another. The electrode layers include an internal electrode. The piezoelectric material layers are formed of the piezoelectric material described above.

A liquid discharge head according to one aspect of the present invention includes a liquid chamber and a discharge port in communication with the liquid chamber. The liquid chamber has a vibrating portion that includes the piezoelectric element or the multilayered piezoelectric element described above.

A liquid discharge apparatus according to one aspect of the present invention includes a stage configured to receive an object and the liquid discharge head described above.

An ultrasonic motor according to one aspect of the present invention includes a vibrating member and a moving body in contact with the vibrating member. The vibrating member includes the piezoelectric element or the multilayered piezoelectric element described above.

An optical apparatus according to one aspect of the present invention includes a drive unit that includes the ultrasonic motor described above.

A vibratory apparatus according to one aspect of the present invention includes a vibrating member that includes the piezoelectric element or the multilayered piezoelectric element described above.

A dust removing device according to one aspect of the present invention includes a vibrating portion including the vibratory apparatus described above.

An image pickup apparatus according to one aspect of the present invention includes the dust removing device described above and an image pickup element unit, wherein the dust removing device includes a vibrating component on a light-receiving surface side of the image pickup element unit.

Electronic equipment according to one aspect of the present invention includes a piezoelectric acoustic component that includes the piezoelectric element or the multilayered piezoelectric element described above.

Advantageous Effects of Invention

The present invention can provide a lead- and potassium-free piezoelectric material having a high piezoelectric constant and a satisfactory insulation property. The present invention also provides a piezoelectric element, a multilayered piezoelectric element, a liquid discharge head, a liquid discharge apparatus, an ultrasonic motor, an optical apparatus, a vibratory apparatus, a dust removing device, an image pickup apparatus, and electronic equipment, each including the piezoelectric material.

A piezoelectric material according to an embodiment of the present invention contains no lead and has a low environmental load. A piezoelectric material according to an embodiment of the present invention also contains no potassium and therefore has satisfactory sinterability and moisture resistance.

DESCRIPTION OF EMBODIMENTS

Figure 1:
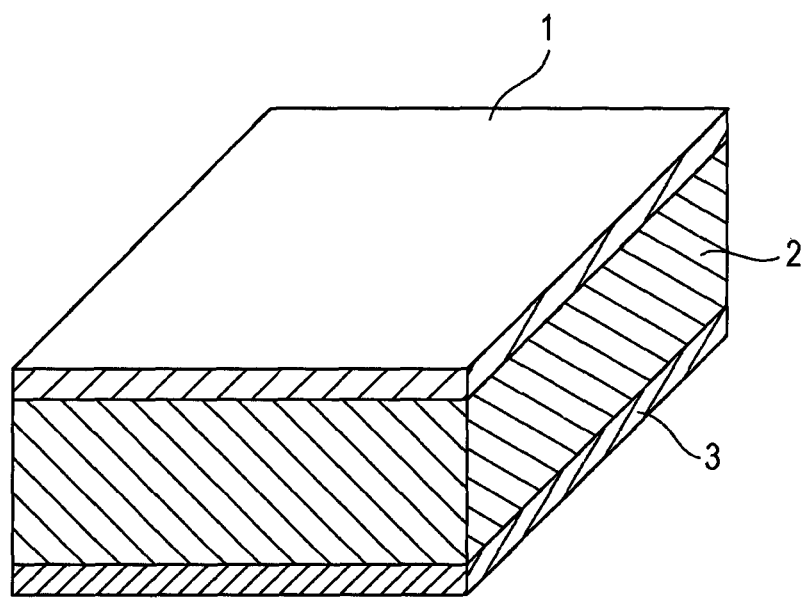
FIG. 1 is a schematic view of a piezoelectric element according to an embodiment of the present invention.

Embodiments of the present invention will be described below.

The present invention provides a lead- and potassium-free piezoelectric material based on a solid solution of barium titanate in sodium niobate (NN-BT) and having a high piezoelectric constant and a satisfactory insulation property. Utilizing its dielectric characteristics, a piezoelectric material according to an embodiment of the present invention can be used in various applications, such as capacitors, memories, and sensors.

A piezoelectric material according to the present invention includes a perovskite-type metal oxide having the following general formula (1) and Zn, wherein the Zn content corresponds to more than 0 mol % and 5 mol % or less of the amount of the perovskite-type metal oxide:

$$(Na_xBa_{1-y})(Nb_yTi_{1-y})O_3 \quad (1)$$

wherein x satisfies $0.80 \leq x \leq 0.95$, and y satisfies $0.85 \leq y \leq 0.95$.

The term "perovskite-type metal oxide", as used herein, refers to a metal oxide having a perovskite-type structure, which is ideally a cubic structure, as described in Iwanami Rikagaku Jiten, 5th edition (Iwanami Shoten, published on Feb. 20, 1998). A metal oxide having a perovskite-type structure is generally represented by the chemical formula $ABO_3$. In a perovskite-type metal oxide, elements A and B in the form of ions occupy particular positions of a unit cell referred to as the A site and the B site, respectively. For a cubic unit cell, the element A occupies the vertexes of the cube, and the element B occupies the body-centered position of the cube. The element O as an oxygen anion occupies the face-centered positions of the cube.

In the metal oxide having the general formula (1), the metallic elements at the A site are Na and Ba, and the metallic elements at the B site are Nb and Ti. Na, Ba, Zn, Cu, and Mn may partly occupy the B site. Likewise, Ti, Nb, Zn, Cu, and Mn may partly occupy the A site. In order to facilitate the production of a piezoelectric material according to an embodiment of the present invention or modify the physical properties of a piezoelectric material according to an embodiment of the present invention, Ba may be partly substituted by a divalent metallic element, such as Sr or Ca. Likewise, 20 mol % or less of Nb may be substituted by a pentavalent metallic element, such as Ta or V. Likewise, 20 mol % or less of Ti may be substituted by Zr or Sn, or 15 mol % or less of Na may be substituted by Li. Likewise, a Ni element may be added to the piezoelectric material in an amount that corresponds to 5 mol % or less of the amount of the perovskite-type metal oxide having the general formula (1). Likewise, at least one element selected from La, Ce, Pr, Nd, Pm, Sm, Eu, Gd, Tb, Dy, Ho, Er, Tm, and Yb may be added to the piezoelectric material in an amount that corresponds to 5 mol % or less of the amount of the perovskite-type metal oxide having the general formula (1). Likewise, 0.001 parts by weight or more and 4.000 parts by weight or less on a metal basis of an auxiliary component containing at least one selected from Si and B may be added to 100 parts by weight of the piezoelectric material.

In the general formula (1), although the molar ratio of the B site element to the element O is 1:3, small variations in the molar ratio (for example, 1.00:2.94 to 1.00:3.06) are within the scope of the present invention, provided that the metal oxide has the perovskite-type structure as the primary phase. The perovskite-type structure of the metal oxide can be determined by structural analysis using X-ray diffraction or electron diffraction.

A piezoelectric material according to an embodiment of the present invention may have any form, such as a ceramic, powder, single crystal, membrane, or slurry, and may be a ceramic. The term "ceramic", as used herein, refers to an aggregate of crystal grains (also referred to as a bulk), that is, a polycrystalline material, containing a metal oxide as the base component and sintered by heat treatment. The term "ceramic" also includes a ceramic processed after sintering.

The value x of the general formula (1), which represents the amount of Na at the A site, may be in the range of $0.80 \leq x \leq 0.95$. A value x of less than 0.80 results in a deficiency of Na relative to Nb and the formation of an impurity phase (a phase having a similar X-ray diffraction pattern to that of $Ba_4Nb_2O_9$, $Ba_4Ti_7Nb_9O_{42}$, $Ba_3Nb_4Ti_4O_{21}$, or $Ba_3Nb_{3.2}Ti_5O_{21}$). Metal oxide samples rich in such an impurity phase have a low resistivity in the range of $10^7$ to $10^8$ Ω·cm and are difficult to polarize. A value x of more than 0.95 results in low piezoelectricity. When x is in the range of $0.80 \leq x \leq 0.95$, the impurity phase rarely occurs, and the piezoelectric material has high piezoelectricity. The value x may be in the range of $0.80 \leq x \leq 0.93$.

The value y of the general formula (1), which represents the amount of Nb at the B site, may be in the range of $0.85 \leq y \leq 0.95$. A value y of less than 0.85 results in a Curie temperature of less than 140° C. A value y of more than 0.95 results in low piezoelectricity. A value y in the range of $0.85 \leq y \leq 0.95$ results in a Curie temperature of 140° C. or more and high piezoelectricity.

A value y in the range of $0.85 \leq y \leq 0.90$ results in a Curie temperature in the range of approximately 130° C. to 230° C., which makes polarization treatment easy. A value y in the range of $0.88 \leq y \leq 0.90$ results in a Curie temperature in the range of approximately 190° C. to 230° C., which results in a low possibility of degradation of piezoelectric performance due to heat in a device manufacturing process.

The Curie temperature is the temperature above which the piezoelectricity of a piezoelectric material disappears. The term "Curie temperature", as used herein, refers to a temperature at which the dielectric constant is highest in the vicinity of the phase transition temperature between a ferroelectric phase and a paraelectric phase. A perovskite-type metal oxide according to an embodiment of the present invention has a successive phase transition temperature in a temperature range lower than the Curie temperature. At the successive phase transition temperature, successive phase transition occurs from a tetragonal crystal ferroelectric phase to an orthorhombic crystal ferroelectric phase. The relative dielectric constant is highest or has an inflection point at the successive phase transition temperature. Thus, in the same manner as in the Curie temperature, the successive phase transition temperature can be determined from the temperature dependence of the relative dielectric constant. For example, a solid solution $0.9(NaNbO_3)\text{-}0.1(BaTiO_3)$ undergoes phase transition from orthorhombic crystals to tetragonal crystals and to cubic crystals as the temperature increases.

The piezoelectric performance is highest in the vicinity of the successive phase transition temperature. Thus, in the driving temperature range of the device (for example, −30° C. to 60° C.), when there is a need for consistent piezoelectric performance that is independent of the temperature, it is desirable that no successive phase transition exist in the driving temperature range. When high piezoelectric performance at a particularly temperature is more important than piezoelectric performance independent of the temperature, the successive phase transition may be in the driving temperature range of the device. A material that has a successive phase transition temperature adjustable to the specifications of devices can be used in various applications.

A piezoelectric material according to an embodiment of the present invention contains Zn in an amount that corresponds to 0 mol % or more and 5 mol % or less, preferably 0.1 mol % or more and 2 mol % or less, of the amount of the perovskite-type metal oxide having the general formula (1). The Zn content expressed in mol % is the molar ratio of Zn on a metal basis. A piezoelectric material according to an embodiment of the present invention containing 5 mol % or less Zn may have an increased piezoelectric constant, electromechanical coupling coefficient, Young's modulus, and density. Such a piezoelectric material may also have a decreased sintering temperature. The sintering temperature is the minimum firing temperature at which a sintered body having a relative density of 95% or more can be formed. Zn can reduce the pinning of spontaneous polarization in a piezoelectric material according to an embodiment of the present invention. A reduction of pinning results in decreased remanent polarization or coercive field in a polarization-electric field hysteresis curve. A reduction of pinning makes it easy to change spontaneous polarization in the same direction through polarization treatment, resulting in a greater change in impedance phase during resonance or an increased electromechanical coupling coefficient.

Zn may be present at the A site (in 12-fold coordination), the B site (in 6-fold coordination), or both of the perovskite structure or may be present at grain boundaries of the ceramic.

Sintering of crystals containing sodium niobate as a component may cause the evaporation or diffusion of Na, and the sample composition after sintering may lack Na relative to Nb. Thus, the A site has defects. However, weighing an excessive amount of Na raw powder may result in a poor insulation property of the sintered body. Thus, part of added Zn may compensate for the defects on the A site. The raw materials may be weighed such that the Na deficiency is not more than 5% relative to Nb.

A piezoelectric material according to an embodiment of the present invention may contain at least one element selected from Cu and Mn in an amount that corresponds to more than 0 mol % and 1 mol % or less of the amount of the perovskite-type metal oxide having the general formula (1).

A piezoelectric material according to an embodiment of the present invention may contain the perovskite-type metal oxide, Zn, and at least one element selected from Cu and Mn. The amount of the at least one element selected from Cu and Mn may correspond to more than 0 mol % and 1 mol % or less, preferably 0.5 mol % or less, of the amount of the perovskite-type metal oxide. The Cu or Mn content expressed in mol % is the molar ratio of Cu or Mn on a metal basis.

A Cu content of 1 mol % or less can result in increases in resistivity, piezoelectric constant, electromechanical coupling coefficient, Young's modulus, and density. This can also decrease the sintering temperature. The sintering temperature is the minimum firing temperature at which a sintered body having a relative density of 95% or more can be formed. Cu can reduce the pinning of spontaneous polarization in a piezoelectric material according to an embodiment of the present invention. A reduction of pinning results in decreased remanent polarization or coercive field in a polarization-electric field hysteresis curve. A reduction of pinning makes it easy to change spontaneous polarization in the same direction through polarization treatment, resulting in a greater change in impedance phase during resonance or an increased electromechanical coupling coefficient.

Cu may be present at the A site (in 12-fold coordination), the B site (in 6-fold coordination), or both of the perovskite structure or may be present at grain boundaries of the ceramic.

Sintering of crystals containing sodium niobate as a component may cause the evaporation or diffusion of Na, and the sample composition after sintering may lack Na relative to Nb. Thus, the A site has defects. However, weighing an excessive amount of Na raw powder may result in a poor insulation property of the sintered body. Thus, part of added Cu may compensate for the defects on the A site. The raw materials may be weighed such that the Na deficiency is not more than 5% relative to Nb.

A piezoelectric material according to an embodiment of the present invention containing 1 mol % or less Mn may have an increased resistivity, piezoelectric constant, electromechanical coupling coefficient, electromechanical quality factor, Young's modulus, and density. This can also decrease the sintering temperature. The sintering temperature is the minimum firing temperature at which a sintered body having a relative density of 95% or more can be formed. Mn can reduce the pinning of spontaneous polarization in a piezoelectric material according to an embodiment of the present invention. A reduction of pinning results in decreased remanent polarization or coercive field in a polarization-electric field hysteresis curve. A reduction of pinning makes it easy to change spontaneous polarization in the same direction through polarization treatment, resulting in a greater change in impedance phase during resonance or an increased electromechanical coupling coefficient.

Mn may be present at the A site (in 12-fold coordination), the B site (in 6-fold coordination), or both of the perovskite structure or may be present at grain boundaries of the ceramic.

Sintering of crystals containing sodium niobate as a component may cause the evaporation or diffusion of Na, and the sample composition after sintering may lack Na relative to Nb. Thus, the A site has defects. However, weighing an excessive amount of Na raw powder may result in a poor insulation property of the sintered body. Thus, part of added Cu may compensate for the defects on the A site. The raw materials may be weighed such that the Na deficiency is not more than 5% relative to Nb.

When Zn occupies the A site and decreases the number of crystal defects, this results in at least one of the following effects.

(1) An increased resistivity.
(2) An increased impedance phase angle during resonance.
(3) Increased remanent polarization as determined by polarization-electric field hysteresis curve measurement or a decreased coercive field.
(4) An increased electromechanical coupling coefficient.
(5) A decreased mechanical quality factor.
(6) A decreased Young's modulus.
(7) A decreased dielectric loss tangent (tan $\delta$).

When Zn occupies the B site, Zn forms a defect dipole together with an oxygen vacancy and forms an internal electric field. Thus, Zn may partly occupy the B site.

When Zn occupies the B site, this results in at least one of the following effects.

(1) A decreased electromechanical coupling coefficient or piezoelectric constant.
(2) An increased mechanical quality factor.
(3) An increased Young's modulus.
(4) Having an internal electric field.

The internal electric field is half the difference between a positive coercive field and a negative coercive field obtained from the measurement of a polarization-electric field hysteresis loop. Since the direction of defective polarization coincides with the direction of the applied electric field through polarization treatment, a sample subjected to polarization treatment may be used to estimate the internal electric field intensity.

At least part of the Zn component is not necessarily disposed at the A or B site and may be disposed at grain boundaries. Zn at grain boundaries may be in its oxide form. Localization of part of Zn at grain boundaries reduces the quantity of pores and increases the mechanical quality factor or Young's modulus. Furthermore, Zn at grain boundaries reduces grain boundary friction and increases the hardness of the material.

The distribution of Zn in a sample and the occupation site in a crystal can be determined with an electron microscope, by energy dispersive X-ray spectroscopy, by X-ray diffraction, by Raman scattering, or with a transmission electron microscope.

Zn in both the A site and the B site has the superposition of these effects. The superposed effects are controllable by adjusting the amount of Zn. Thus, Zn may be disposed at both the A site and the B site.

When Zn is disposed only at the A site, the volume of the unit cell decreases because Zn ions are smaller than Na ions or Ba ions. The unit cell volume can be measured by X-ray diffraction.

When the Zn content corresponds to more than 5 mol % of the amount of the perovskite-type metal oxide, this may result in the occurrence of an impurity phase and low piezoelectricity.

A piezoelectric material according to an embodiment of the present invention may satisfy $x<y$ in the general formula (1). Under the condition of $x<y$, Zn is taken in the crystal lattice, and the advantages of the present invention can be easily achieved. The starting materials may have such a composition that x is smaller than y. When x is greater than or equal to y, the sample has a poor insulation property.

In order to produce a piezoelectric ceramic using a piezoelectric material according to an embodiment of the present invention, a green compact is prepared. The green compact is a shaped solid of the raw powder. The raw powder may be of high purity. Since Mg greatly affects the piezoelectric performance of a sample, the Mg content of the raw materials may be reduced. The compact can be formed by uniaxial pressing, cold hydrostatic pressing, hot hydrostatic pressing, slip casting, or extrusion molding. The compact may be formed from a granulated powder. Sintering of the compact formed from a granulated powder has an advantage that the grain size distribution of the sintered body tends to become uniform.

The raw material powder of a piezoelectric material may be granulated by any method. Spray drying can make the particle size of the granulated powder more uniform.

A binder for use in granulation may be poly(vinyl alcohol) (PVA), poly(vinyl butyral) (PVB), or an acrylic resin. The amount of binder is preferably in the range of 1 to 10 parts by weight per 100 parts by weight of the raw material powder of the piezoelectric material, more preferably 2 to 5 parts by weight in order to increase the compact density.

The compact may be sintered by any method. Examples of the sintering method include sintering in an electric furnace, sintering in a gas furnace, electric heating, microwave sintering, millimeter-wave sintering, and hot isostatic pressing (HIP). Sintering in an electric furnace or a gas furnace may be performed in a continuous furnace or a batch furnace.

The sintering temperature in the sintering method is not particularly limited and may be a temperature at which the compounds can react to sufficiently grow crystals. The sintering temperature is preferably 1050° C. or more and 1300° C. or less, more preferably 1100° C. or more and 1200° C. or less, such that the average grain size is in the range of 0.3 to 100 μm. A piezoelectric material sintered in the temperature range described above has satisfactory piezoelectric performance. In order to ensure the reproducibility and stability of the characteristics of a piezoelectric material produced by sintering, sintering may be performed at a constant temperature within the range described above for 2 hours or more and 48 hours or less. Although two-step sintering may also be performed, a sintering method without an abrupt temperature change can improve productivity.

A piezoelectric material produced by sintering may be polished and then heat-treated at the Curie temperature or higher. Heat treatment of the piezoelectric material at the Curie temperature or higher can relieve the residual stress of the piezoelectric material resulting from mechanically polishing and thereby improves the piezoelectric property of the piezoelectric material. The heat-treatment time may be, but is not limited to, one hour or more.

A piezoelectric material according to an embodiment of the present invention having a crystal grain size of more than 100 μm may have an insufficient strength in a cutting process and a polishing process. A grain size of less than 0.3 μm may result in low piezoelectricity. Thus, the average grain size is preferably 0.3 μm or more and 100 μm or less, more preferably 0.5 μm or more and 70 μm or less.

It is desirable that when a piezoelectric material according to an embodiment of the present invention is used as a film formed on a substrate, the thickness of the piezoelectric material film be 200 nm or more and 10 μm or less, more preferably 300 nm or more and 3 μm or less. This is because when the thickness of the piezoelectric material film is 200 nm or more and 10 μm or less the piezoelectric element has a sufficient electromechanical conversion function.

The film may be formed by any method, for example, a chemical solution deposition method (a CSD method), a sol-gel method, a metal-organic chemical vapor deposition method (a MOCVD method), a sputtering method, a pulsed laser deposition method (a PLD method), a hydrothermal synthesis method, or an aerosol deposition method (an AD method). The film may be formed by a chemical solution deposition method or a sputtering method. The area of the film can easily be increased using the chemical solution deposition method or the sputtering method. The substrate used for a piezoelectric material according to an embodiment of the present invention may be a single-crystal substrate having a polished (001) or (110) section. Use of such a single-crystal substrate having a particular polished crystal face allows the piezoelectric material film formed on the substrate surface to be strongly oriented in the same direction.

(Piezoelectric Element)

A piezoelectric element manufactured using a piezoelectric material according to an embodiment of the present invention will be described below.

FIG. 1 is a schematic view of a piezoelectric element according to an embodiment of the present invention. The piezoelectric element includes a first electrode 1, a piezoelectric material portion 2, and a second electrode 3. The piezoelectric material of the piezoelectric material portion 2 is a piezoelectric material according to an embodiment of the present invention.

The piezoelectric property of the piezoelectric material can be evaluated by at least attaching the first electrode 1 and the second electrode 3 to the piezoelectric material portion 2 to form the piezoelectric element. Each of the first electrode 1 and the second electrode 3 is an electrically conductive layer having a thickness in the range of approximately 5 nm to 10 μm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof.

Each of the first electrode 1 and the second electrode 3 may be made of one of these materials or may be a multilayer film made of two or more of the materials. The material(s) of the first electrode 1 may be different from the material(s) of the second electrode 3.

The first electrode 1 and the second electrode 3 may be manufactured by any method, for example, by baking a metal paste or using a sputtering process or a vapor deposition method. The first electrode 1 and the second electrode 3 may have a desired pattern.

The piezoelectric element may have a unidirectional polarization axis. Having the unidirectional polarization axis can increase the piezoelectric constant of the piezoelectric element.

The polarization method for the piezoelectric element is not particularly limited. Polarization treatment may be performed in the ambient atmosphere or in an oil. The polarization temperature may be in the range of 60° C. to 160° C. The optimum conditions for polarization may vary with the composition of the piezoelectric material of the piezoelectric element. The electric field for the polarization treatment may be greater than or equal to the coercive field of the material and more specifically may be in the range of 1 to 5 kV/mm.

The piezoelectric constant and the electromechanical quality factor of the piezoelectric element can be calculated from the resonance frequency and the antiresonant frequency measured with a commercially available impedance analyzer in accordance with a standard of Japan Electronics and Information Technology Industries Association (JEITA EM-4501). This method is hereinafter referred to as a resonance-antiresonance method.

(Multilayered Piezoelectric Element)

A multilayered piezoelectric element manufactured using a piezoelectric material according to an embodiment of the present invention will be described below.

A multilayered piezoelectric element according to an embodiment of the present invention includes piezoelectric material layers and electrodes alternately stacked on top of one another. The electrodes include an internal electrode. The piezoelectric material layers are formed of a piezoelectric material according to an embodiment of the present invention.

Figure 2A:
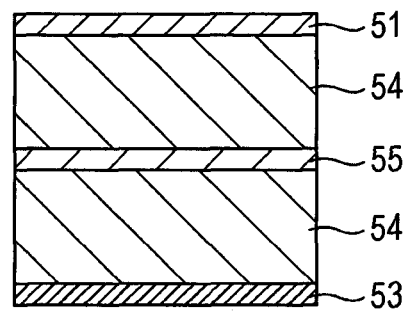
FIGS. 2A and 2B are schematic cross-sectional views of a multilayered piezoelectric element according to an embodiment of the present invention.
Figure 2B:
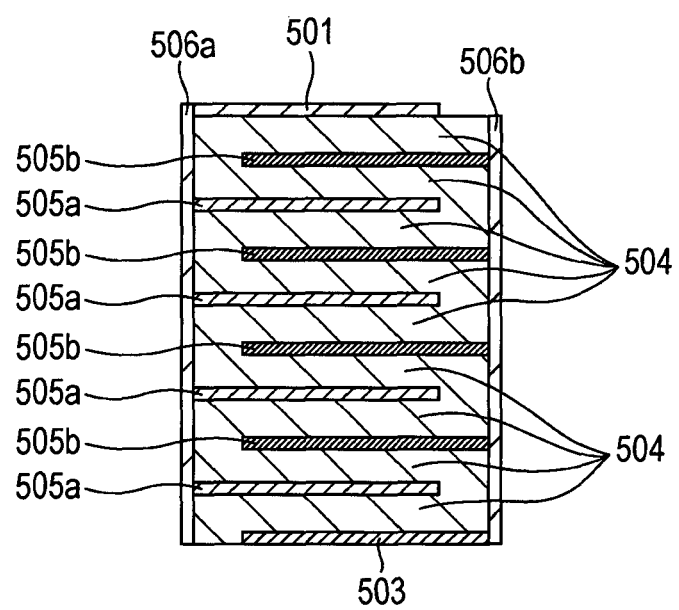

FIGS. 2A and 2B are schematic cross-sectional views of a multilayered piezoelectric element according to an embodiment of the present invention. A multilayered piezoelectric element according to an embodiment of the present invention includes piezoelectric material layers 54 and electrodes including an internal electrode 55. The multilayered piezoelectric element includes the piezoelectric material layers and the layered electrodes alternately stacked on top of one another. The piezoelectric material layers 54 are made of the piezoelectric material described above. The electrodes may include external electrodes, such as a first electrode 51 and a second electrode 53, as well as the internal electrode 55.

FIG. 2A illustrates a multilayered piezoelectric element according to an embodiment of the present invention that includes a layered body 56 between the first electrode 51 and the second electrode 53, wherein the layered body includes two piezoelectric material layers 54 with one internal electrode 55 interposed therebetween. The number of piezoelectric material layers and the number of internal electrodes are not particularly limited and may be increased, as illustrated in FIG. 2B. The multilayered piezoelectric element illustrated in FIG. 2B includes a layered body between a first electrode 501 and a second electrode 503. The layered body includes nine piezoelectric material layers 504 and eight internal electrodes 505 (505a and 505b) alternately stacked on top of one another. The multilayered piezoelectric element further includes an external electrode 506a and an external electrode 506b for connecting the internal electrodes to each other.

The size and shape of the internal electrodes 55 and 505 and the external electrodes 506a and 506b may be different from the size and shape of the piezoelectric material layers 54 and 504. Each of the internal electrodes 55 and 505 and the external electrodes 506a and 506b may be composed of a plurality of portions.

Each of the internal electrodes 55 and 505, the external electrodes 506a and 506b, the first electrodes 51 and 501, and the second electrodes 53 and 503 is an electrically conductive layer having a thickness in the range of approximately 5 to 2000 nm. The material of each of the electrodes is not particularly limited and may be any material that is commonly used for piezoelectric elements. Examples of such a material include metals, such as Ti, Pt, Ta, Ir, Sr, In, Sn, Au, Al, Fe, Cr, Ni, Pd, Ag, and Cu, and compounds thereof. Each of the internal electrodes 55 and 505 and the external electrodes 506a and 506b may be made of one of these materials or a mixture or an alloy thereof or may be a multilayer film made of two or more of the materials. These electrodes may be made of different materials. The internal electrodes 55 and 505 may contain at least one of Ni and Cu, which are inexpensive electrode materials. When the internal electrodes 55 and 505 contain at least one of Ni and Cu, the multilayered piezoelectric element may be baked in a reducing atmosphere.

The internal electrode 55 and the internal electrodes 505 of the multilayered piezoelectric element may contain Ag and Pd. The weight ratio M1/M2 of the weight M1 of Ag to the weight M2 of Pd is preferably in the range of $1.5 \leq M1/M2 \leq 9.0$, more preferably $2.3 \leq M1/M2 \leq 4.0$. A weight ratio M1/M2 of less than 1.5 is undesirable because of a high sintering temperature of the internal electrode(s). A weight ratio M1/M2 of more than 9.0 is also undesirable because the internal electrode(s) has an island structure and a heterogeneous surface.

As illustrated in FIG. 2B, the plurality of electrodes including the internal electrodes 505 may be connected to each other in order to synchronize the driving voltage phases. For example, the internal electrodes 505a may be connected to the first electrode 501 through the external electrode 506a. The electrodes may be connected by any method. For example, an electrode or an electric wire for connection may be disposed on a side surface of the multilayered piezoelectric element. Alternatively, a through-hole passing through the piezoelectric material layers 504 may be formed, and the inside of the through-hole may be coated with an electrically conductive material to connect the electrodes.

(Liquid Discharge Head)

A liquid discharge head according to an embodiment of the present invention includes a liquid chamber and a discharge port in communication with the liquid chamber. The liquid chamber includes a vibrating portion that includes a piezoelectric element or a multilayered piezoelectric element according to an embodiment of the present invention. A liquid to be discharged from a liquid discharge head according to an embodiment of the present invention may be any fluid, for example, an aqueous liquid or a nonaqueous liquid, such as water, an ink, or a fuel.

Figure 3A:
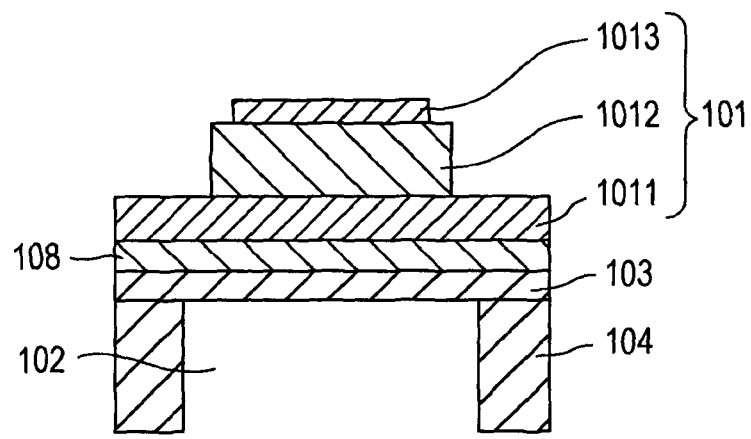
FIGS. 3A and 3B are schematic views of a liquid discharge head according to an embodiment of the present invention.
Figure 3B:
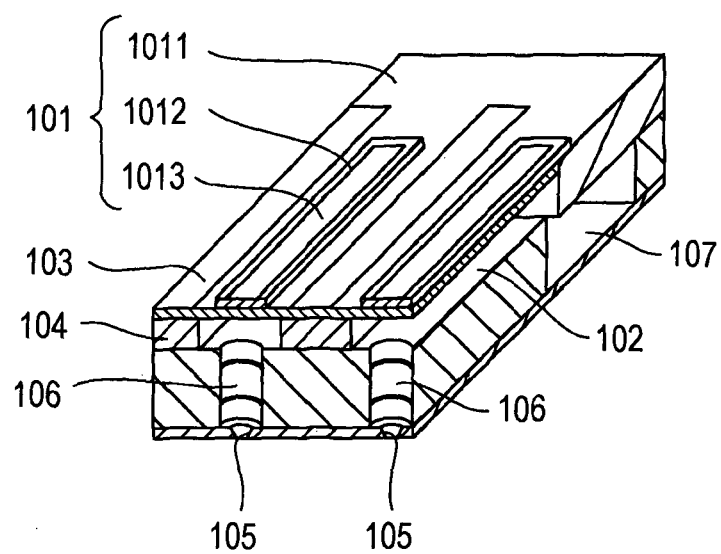

FIGS. 3A and 3B are schematic views of a liquid discharge head according to an embodiment of the present invention. As illustrated in FIGS. 3A and 3B, the liquid discharge head includes a piezoelectric element 101 according to an embodiment of the present invention. The piezoelectric element 101 includes a first electrode 1011, a piezoelectric material 1012, and a second electrode 1013. The piezoelectric material 1012 may be patterned, as illustrated in FIG. 3B.

FIG. 3B is a schematic view of the liquid discharge head. The liquid discharge head includes a discharge port 105, an individual liquid chamber 102, a communicating hole 106 that connects the individual liquid chamber 102 to the discharge port 105, a liquid chamber partition wall 104, a common liquid chamber 107, a diaphragm 103, and the piezoelectric element 101. Although the piezoelectric element 101 is rectangular in FIG. 3B, the piezoelectric element 101 may be of another shape, such as elliptical, circular, or parallelogrammic. In general, the piezoelectric material 1012 has a shape corresponding to the shape of the individual liquid chamber 102.

The piezoelectric element 101 of the liquid discharge head will be described in detail below with reference to FIG. 3A. FIG. 3A is a cross-sectional view of FIG. 3B in the width direction of the piezoelectric element. Although the piezoelectric element 101 has a rectangular cross section in FIG. 3A, the piezoelectric element 101 may have a trapezoidal or inverted trapezoidal cross section.

In FIG. 3A, the first electrode 1011 is a lower electrode, and the second electrode 1013 is an upper electrode. The first electrode 1011 and the second electrode 1013 may be arranged differently. For example, the first electrode 1011 may be a lower electrode or an upper electrode. Likewise, the second electrode 1013 may be an upper electrode or a lower electrode. A buffer layer 108 may be disposed between the diaphragm 103 and the lower electrode. These different designations result from variations in the method for manufacturing the device, and each of the cases has the advantages of the present invention.

In the liquid discharge head, the diaphragm 103 bends upward and downward with the expansion and contraction of the piezoelectric material 1012, thereby applying pressure to a liquid in the individual liquid chamber 102. This allows the liquid to be discharged from the discharge port 105. A liquid discharge head according to an embodiment of the present invention can be used in printers and in the manufacture of electronic equipment. The diaphragm 103 has a thickness of 1.0 μm or more and 15 μm or less, preferably 1.5 μm or more and 8 μm or less. The material of the diaphragm is not particularly limited and may be Si. Si of the diaphragm may be doped with boron or phosphorus. The buffer layer and the electrode on the diaphragm may constitute the diaphragm.

The buffer layer 108 has a thickness of 5 nm or more and 300 nm or less, preferably 10 nm or more and 200 nm or less. The discharge port 105 has an equivalent circular diameter of 5 μm or more and 40 μm or less. The discharge port 105 may be circular, star-shaped, square, or triangular.

(Liquid Discharge Apparatus)

A liquid discharge apparatus according to an embodiment of the present invention will be described below. The liquid discharge apparatus includes a stage configured to receive an object and the liquid discharge head.

Figure 4:
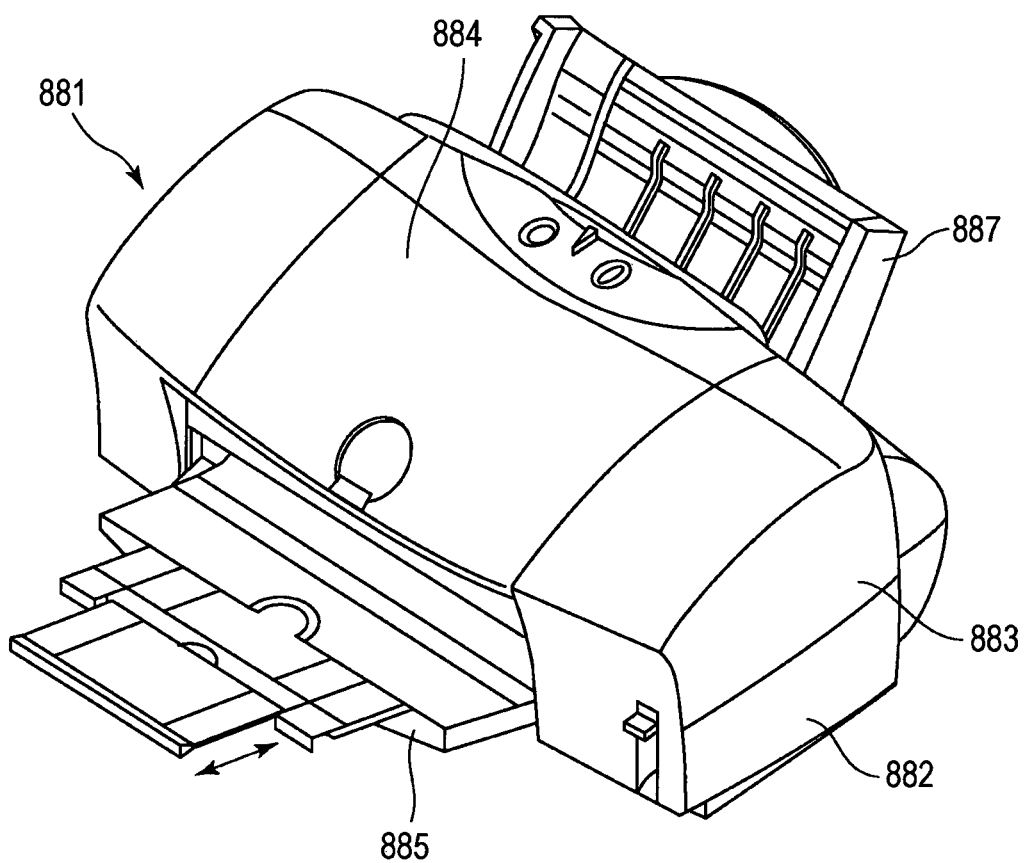
FIG. 4 is a schematic view of a liquid discharge apparatus according to an embodiment of the present invention.
Figure 5:
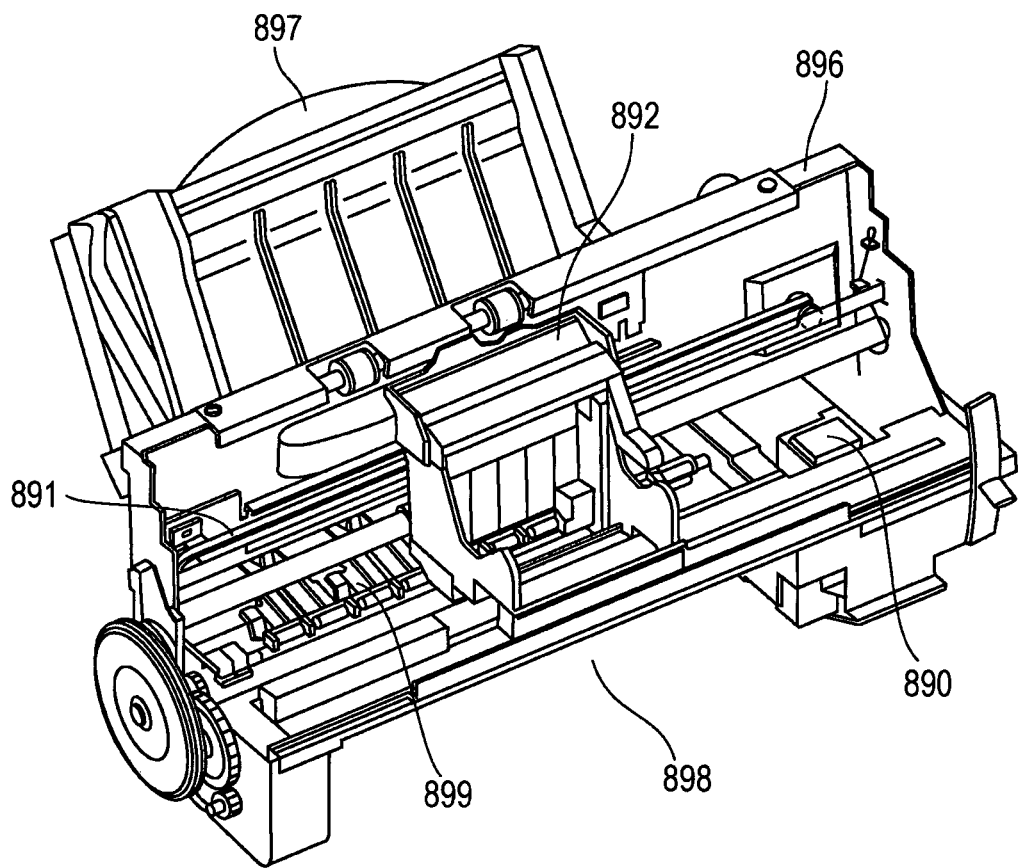
FIG. 5 is a schematic view of a liquid discharge apparatus according to an embodiment of the present invention.

The liquid discharge apparatus may be an ink jet recording apparatus, as illustrated in FIGS. 4 and 5. FIG. 5 illustrates the liquid discharge apparatus (ink jet recording apparatus) 881 illustrated in FIG. 4 without exteriors 882 to 885 and 887. The ink jet recording apparatus 881 includes an automatic feeder 897 for automatically feeding a recording paper sheet as a transfer medium to the main body 896 of the apparatus. The ink jet recording apparatus 881 further includes a conveying unit 899 serving as a stage configured to receive an object, which conveys a recording paper sheet from the automatic feeder 897 to a predetermined recording position and from the recording position to an outlet 898, a recording unit 891 for recording to the recording paper at the recording position, and a recovering unit 890 for recovering the recording unit 891. The recording unit 891 includes a carriage 892 for housing a liquid discharge head according to an embodiment of the present invention. The carriage 892 travels along a rail.

In such an ink jet recording apparatus, the carriage 892 travels along a rail in response to electric signals sent from a computer. Upon the application of a driving voltage to electrodes disposed on a piezoelectric material, the piezoelectric material is deformed. Upon the deformation, the piezoelectric material presses the individual liquid chamber 102 via the diaphragm 103 illustrated in FIG. 3B, thereby discharging an ink from the discharge port 105 to print characters. A liquid discharge apparatus according to an embodiment of the present invention can uniformly discharge a liquid at a high speed and can be reduced in size.

In addition to the printer described above, a liquid discharge apparatus according to an embodiment of the present invention can be used in printing apparatuses, for example, ink jet recording apparatuses, such as facsimile machines, multifunction devices, and copying machines, industrial liquid discharge apparatuses, and drawing apparatuses for objects.

Users can select a desired transfer medium for each application. The liquid discharge head may move relative to a transfer medium disposed on a stage serving as a mounting portion.

(Ultrasonic Motor)

Figure 6A:
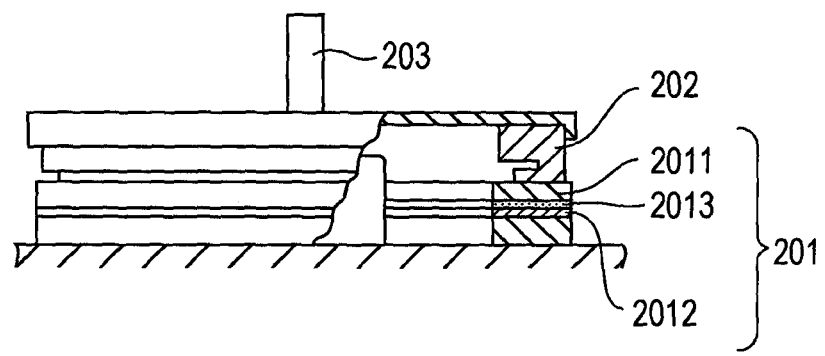
FIGS. 6A and 6B are schematic views of an ultrasonic motor according to an embodiment of the present invention.
Figure 6B:
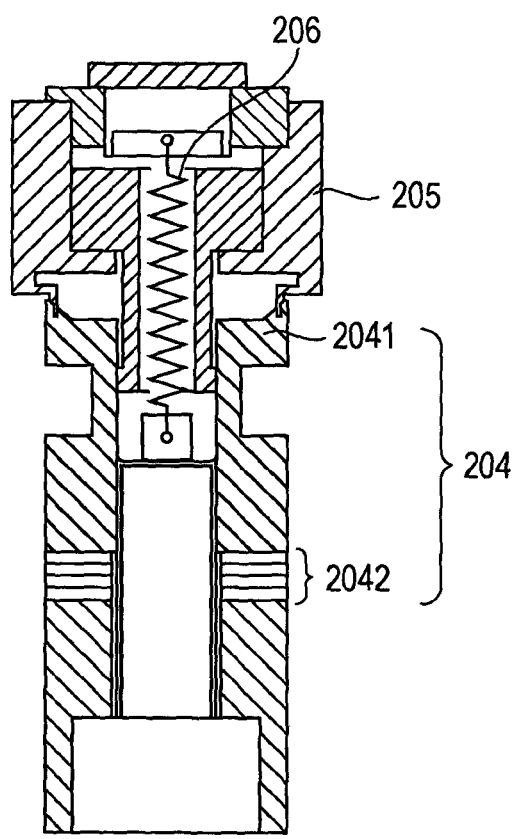

An ultrasonic motor according to an embodiment of the present invention includes a vibrating member and a moving body in contact with the vibrating member. The vibrating member includes a piezoelectric element or a multilayered piezoelectric element according to an embodiment of the present invention. FIGS. 6A and 6B are schematic views of an ultrasonic motor according to an embodiment of the present invention. The ultrasonic motor illustrated in FIG. 6A includes a single plate of a piezoelectric element according to an embodiment of the present invention. The ultrasonic motor includes an oscillator 201, a rotor 202 pressed against a sliding surface of the oscillator 201 by the action of a pressure spring (not shown), and an output shaft 203, which is formed integrally with the rotor 202. The oscillator 201 includes a metal elastic ring 2011, a piezoelectric element 2012 according to an embodiment of the present invention, and an organic adhesive 2013 (such as epoxy or cyanoacrylate) that bonds the piezoelectric element 2012 to the elastic ring 2011. Although not shown in the figure, the piezoelectric element 2012 includes a piezoelectric material between a first electrode and a second electrode.

Upon the application of two-phase alternating voltages that differ by an odd number times m/2 in phase to a piezoelectric element according to an embodiment of the present invention, a flexural traveling wave occurs in the oscillator 201, and points on the sliding surface of the oscillator 201 go through elliptical motion. The rotor 202 pressed against the sliding surface of the oscillator 201 receives friction force from the oscillator 201 and rotates in a direction opposite to the direction of the flexural traveling wave. A body to be driven (not shown) joined to the output shaft 203 is driven by the rotational force of the rotor 202. Upon the application of a voltage to a piezoelectric material, the piezoelectric material expands and contracts because of the transverse piezoelectric effect. An elastic body, such as a metal, joined to the piezoelectric element is bent with the expansion and contraction of the piezoelectric material. The ultrasonic motor described herein utilizes this principle.

FIG. 6B illustrates an ultrasonic motor that includes a multilayered piezoelectric element. The oscillator 204 includes a multilayered piezoelectric element 2042 in a tubular metal elastic body 2041. The multilayered piezoelectric element 2042 includes a plurality of layered piezoelectric materials (not shown) and includes a first electrode and a second electrode on the outer surfaces of the layered piezoelectric materials and internal electrodes within the layered piezoelectric materials. The metal elastic body 2041 is fastened with a bolt to hold the piezoelectric element 2042, thereby constituting the oscillator 204. Upon the application of alternating voltages of different phases to the piezoelectric element 2042, the oscillator 204 causes two oscillations perpendicular to each other. The two oscillations are synthesized to form a circular oscillation for driving the tip of the oscillator 204. The oscillator 204 has an annular groove at its upper portion. The annular groove increases the oscillatory displacement for driving. A rotor 205 is pressed against the oscillator 204 by the action of a pressure spring 206 and receives friction force for driving. The rotor 205 is rotatably supported by a bearing.

(Optical Apparatus)

An optical apparatus according to an embodiment of the present invention will be described below. The optical apparatus includes a drive unit that includes the ultrasonic motor described above.

Figure 7A:
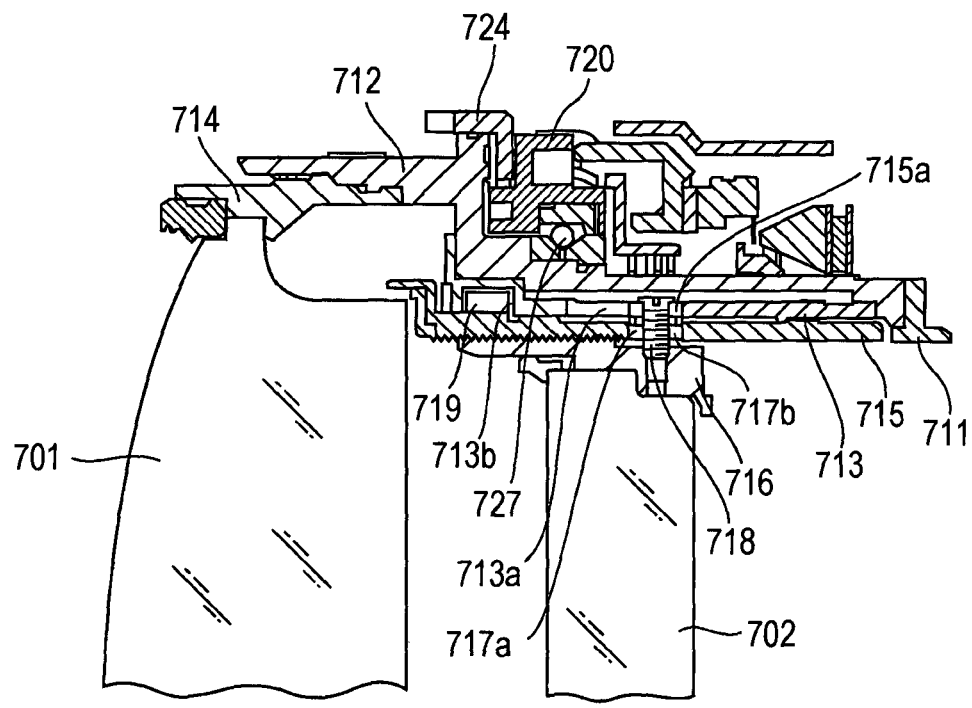
FIGS. 7A and 7B are schematic views of an optical apparatus according to an embodiment of the present invention.
Figure 7B:
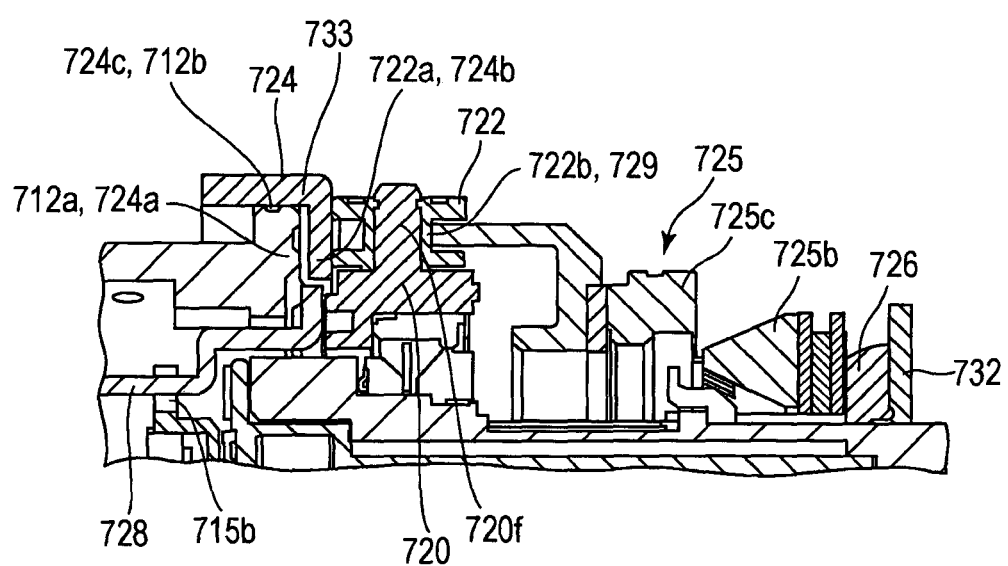
Figure 8:
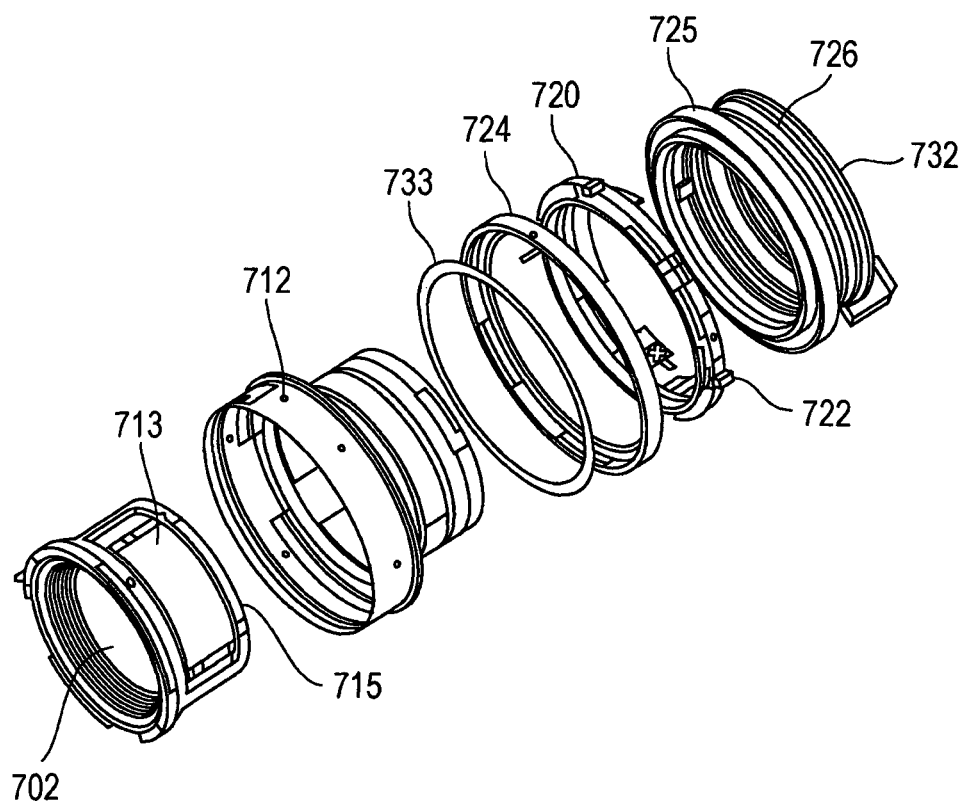
FIG. 8 is a schematic view of an optical apparatus according to an embodiment of the present invention.

FIGS. 7A and 7B are cross-sectional views of an interchangeable lens barrel of a single-lens reflex camera, which is an optical apparatus according to an embodiment of the present invention. FIG. 8 is an exploded perspective view of an interchangeable lens barrel of a single-lens reflex camera, which is an optical apparatus according to an embodiment of the present invention. A fixed barrel 712, a linear guide barrel 713, and a front lens group barrel 714 are fixed to a removable mount 711 of the camera. These components are fixed members of the interchangeable lens barrel.

The linear guide barrel 713 has a linear guide groove 713a for a focus lens 702 in the optical axis direction. The focus lens 702 is supported by a rear lens group barrel 716. Cam rollers 717a and 717b protruding outwardly in the radial direction are fixed to the rear lens group barrel 716 with a screw 718. The cam roller 717a fits in the linear guide groove 713a.

A cam ring 715 rotatably fits in the internal circumference of the linear guide barrel 713. A roller 719 fixed to the cam ring 715 is caught in an annular groove 713b of the linear guide barrel 713, thereby restricting the relative displacement of the linear guide barrel 713 and the cam ring 715 in the optical axis direction. The cam ring 715 has a cam groove 715a for the focus lens 702. The cam roller 717b also fits in the cam groove 715a.

A rotation transmitting ring 720 is rotatably held by a ball race 727 at a fixed position on the periphery of the fixed barrel 712. A driven roller 722 is rotatably held by a shaft 720f extending radially from the rotation transmitting ring 720. A large-diameter portion 722a of the driven roller 722 is in contact with a mount side end face 724b of a manual focus ring 724. A small-diameter portion 722b of the driven roller 722 is in contact with a joint 729. Six driven rollers 722 are disposed at regular intervals on the periphery of the rotation transmitting ring 720. Each of the driven rollers 722 satisfies the structural relationship described above.

A low-friction sheet (washer member) 733 is disposed on the inside of the manual focus ring 724. The low-friction sheet 733 is disposed between a mount side end face 712a of the fixed barrel 712 and a front end face 724a of the manual focus ring 724. The low-friction sheet 733 has a circular outer surface having a diameter that fits to the inner diameter 724c of the manual focus ring 724. The inner diameter 724c of the manual focus ring 724 fits to the diameter of an outer portion 712b of the fixed barrel 712. The low-friction sheet 733 can reduce friction in the rotating ring mechanism in which the manual focus ring 724 rotates about the optical axis relative to the fixed barrel 712.

The large-diameter portion 722a of the driven roller 722 is pressed against the mount side end face 724b of the manual focus ring 724 because the wave washer 726 presses the ultrasonic motor 725 forward to the front of the lens. Likewise, because the wave washer 726 presses the ultrasonic motor 725 forward to the front of the lens, the small-diameter portion 722b of the driven roller 722 is pressed against the joint 729. The wave washer 726 is prevented from moving toward the mount by a washer 732 bayonet coupled to the fixed barrel 712. The spring force (impellent force) of the wave washer 726 is transmitted to the ultrasonic motor 725 and the driven roller 722 and also presses the manual focus ring 724 against the mount side end face 712a of the fixed barrel 712. In other words, the manual focus ring 724 is pressed against the mount side end face 712a of the fixed barrel 712 via the low-friction sheet 733.

Thus, when the ultrasonic motor 725 is rotated by a control unit (not shown) relative to the fixed barrel 712, the driven roller 722 rotates about the shaft 720f because the joint 729 is in frictional contact with the small-diameter portion 722b of the driven roller 722. The rotation of the driven roller 722 about the shaft 720f causes the rotation of the rotation transmitting ring 720 about the optical axis (automatic focusing).

When a manual input unit (not shown) provides the manual focus ring 724 with rotational force about the optical axis, since the mount side end face 724b of the manual focus ring 724 is pressed against the large-diameter portion 722a of the driven roller 722, the driven roller 722 is rotated about the shaft 720f because of friction force. The rotation of the large-diameter portion 722a of the driven roller 722 about the shaft 720f causes the rotation of the rotation transmitting ring 720 about the optical axis. However, the ultrasonic motor 725 is not rotated because of the friction force between a rotor 725c and a stator 725b (manual focusing).

The rotation transmitting ring 720 is provided with two focus keys 728 facing each other. These focus keys 728 fit into notches 715b at the tip of the cam ring 715. Upon automatic focusing or manual focusing, the rotation transmitting ring 720 is rotated about the optical axis, and the rotational force is transmitted to the cam ring 715 via the focus keys 728. When the cam ring 715 is rotated about the optical axis, the cam roller 717b moves the cam roller 717a and the rear group lens barrel 716 restricted by the linear guide groove 713a forward or backward along the cam groove 715a of the cam ring 715. This drives the focus lens 702 and allows focusing.

Although an optical apparatus according to an embodiment of the present invention has been described with reference to an interchangeable lens barrel of a single-lens reflex camera, the optical apparatus may also be applied to optical apparatuses that include an ultrasonic motor in a drive unit, for example, cameras, such as compact cameras, electronic still cameras, and personal digital assistants including a camera.

(Vibratory Apparatus and Dust Removing Device)

Vibratory apparatuses for conveying or removing particles, powders, and droplets are widely used in electronic equipment.

As an example of a vibratory apparatus according to the present invention, a dust removing device that includes a piezoelectric element according to an embodiment of the present invention will be described below. A vibratory apparatus according to an embodiment of the present invention includes a vibrating member that includes the piezoelectric element or the multilayered piezoelectric element described above. A dust removing device according to an embodiment of the present invention includes a vibrating member that includes a piezoelectric element or a multilayered piezoelectric element according to an embodiment of the present invention on a diaphragm.

Figure 9A:
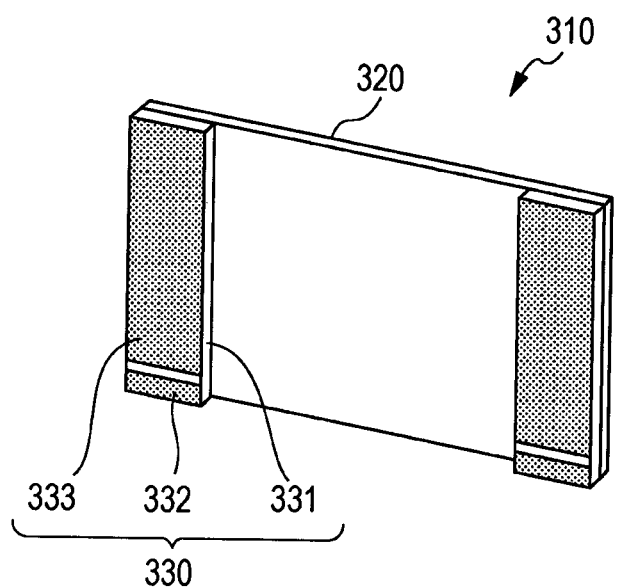
FIGS. 9A and 9B are schematic views of a dust removing device including a vibratory apparatus according to an embodiment of the present invention.
Figure 9B:
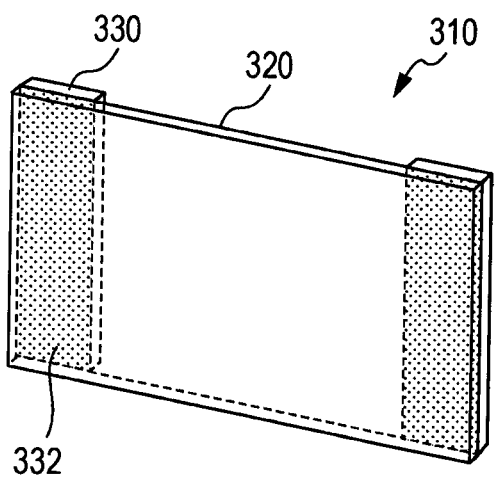

FIGS. 9A and 9B are schematic views of a dust removing device 310 according to an embodiment of the present invention. The dust removing device 310 includes a plate of the piezoelectric element 330 and the diaphragm 320. The piezoelectric element 330 may be a multilayered piezoelectric element according to an embodiment of the present invention. The diaphragm 320 may be made of any material. When the dust removing device 310 is used in optical devices, the diaphragm 320 may be made of a translucent or transparent material or a light reflective material.

Figure 10A:
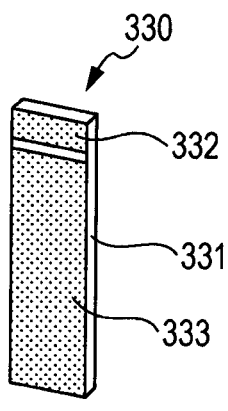
FIGS. 10A to 10C are schematic views of a piezoelectric element of a dust removing device according to an embodiment of the present invention.
Figure 10B:
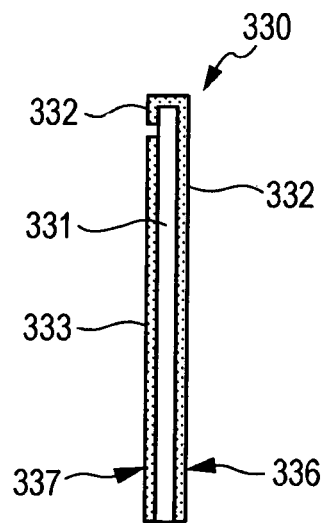
Figure 10C:
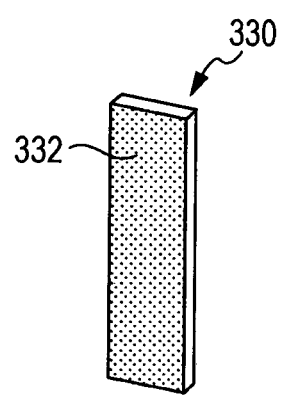

FIGS. 10A to 10C are schematic views of the piezoelectric element 330 illustrated in FIGS. 9A and 9B. FIGS. 10A and 10C illustrate the front and back sides of the piezoelectric element 330. FIG. 10B is a side view of the piezoelectric element 330. As illustrated in FIGS. 9A and 9B, the piezoelectric element 330 includes a piezoelectric material 331, a first electrode 332, and a second electrode 333. The first electrode 332 and the second electrode 333 are disposed on opposite sides of the piezoelectric material 331. As in FIGS. 9A and 9B, the piezoelectric element 330 may be a multilayered piezoelectric element according to an embodiment of the present invention. In this case, the piezoelectric material 331 includes piezoelectric material layers and internal electrodes alternately stacked on top of one another. The internal electrodes are alternately connected to the first electrode 332 and the second electrode 333, thereby allowing the piezoelectric material layers to alternately have drive waveforms of different phases. As illustrated in FIG. 10C, a surface of the piezoelectric element 330 on which the first electrode 332 is disposed is referred to as a first electrode surface 336. As illustrated in FIG. 10A, a surface of the piezoelectric element 330 on which the second electrode 333 is disposed is referred to as a second electrode surface 337.

The term "electrode surface", as used herein, refers to a surface of a piezoelectric element on which an electrode is disposed. For example, as illustrated in FIG. 10B, the first electrode 332 may round a corner and extends to the second electrode surface 337.

As illustrated in FIGS. 9A and 9B, the first electrode surface 336 of the piezoelectric element 330 is bonded to the diaphragm 320. Actuation of the piezoelectric element 330 produces a stress between the piezoelectric element 330 and the diaphragm 320, causing out-of-plane oscillations on the diaphragm 320. The dust removing device 310 removes foreign matter, such as dust, on the diaphragm 320 by the action of out-of-plane oscillations. The term "out-of-plane oscillations", as used herein, refers to elastic oscillations that cause displacements of a diaphragm in the optical axis direction or the diaphragm thickness direction.

Figures 11A, 11B:
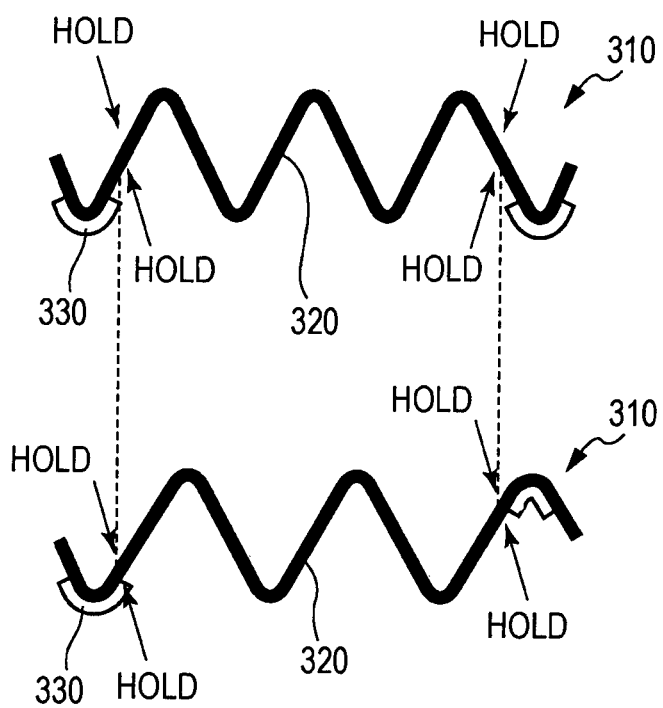
FIGS. 11A and 11B are schematic views illustrating the vibration principle of a dust removing device according to an embodiment of the present invention.

FIGS. 11A and 11B are schematic views illustrating the vibration principle of the dust removing device 310. In FIG. 11A, in-phase alternating voltages are applied to a left-and-right pair of the piezoelectric elements 330 to cause out-of-plane oscillations of the diaphragm 320. The direction of polarization of the piezoelectric material constituting the left-and-right pair of the piezoelectric elements 330 is the same as the thickness direction of the piezoelectric elements 330. The dust removing device 310 is driven in a seventh oscillation mode. In FIG. 11B, an anti-phase alternating voltage is applied to a left-and-right pair of the piezoelectric elements 330 to cause out-of-plane oscillations of the diaphragm 320. The dust removing device 310 is driven in a sixth oscillation mode. The dust removing device 310 can employ at least two oscillation modes to effectively remove dust on the surface of the diaphragm.

(Image Pickup Apparatus)

Figure 12:
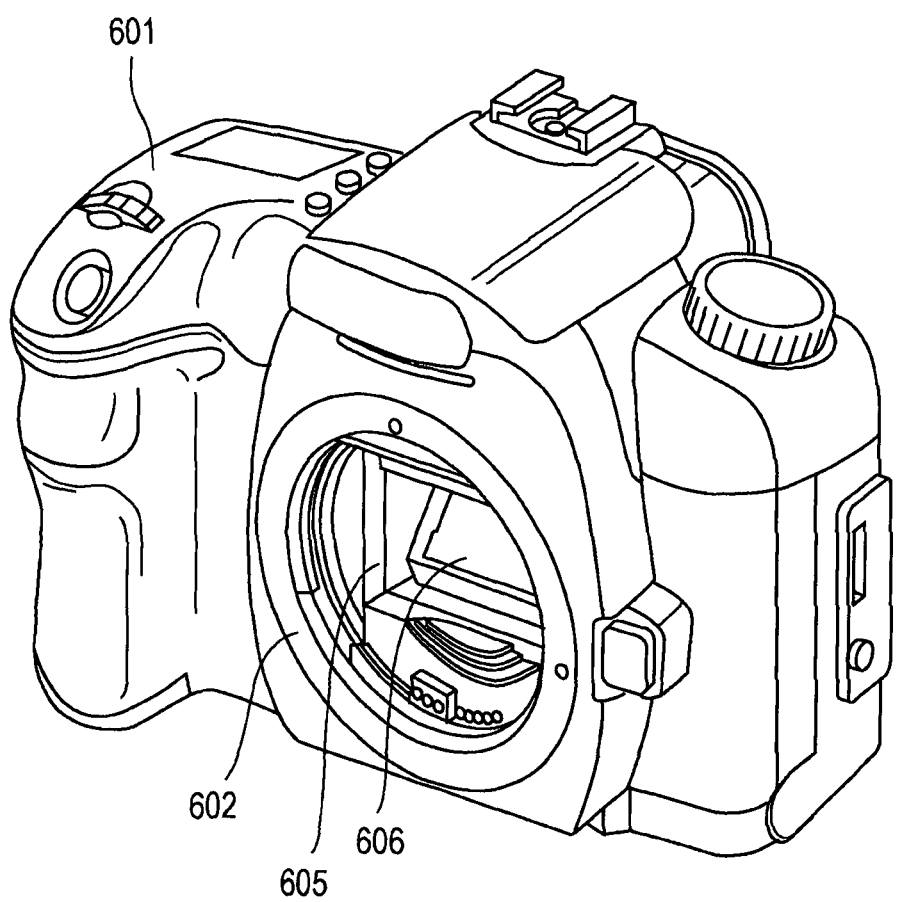
FIG. 12 is a schematic view of an image pickup apparatus according to an embodiment of the present invention.
Figure 13:
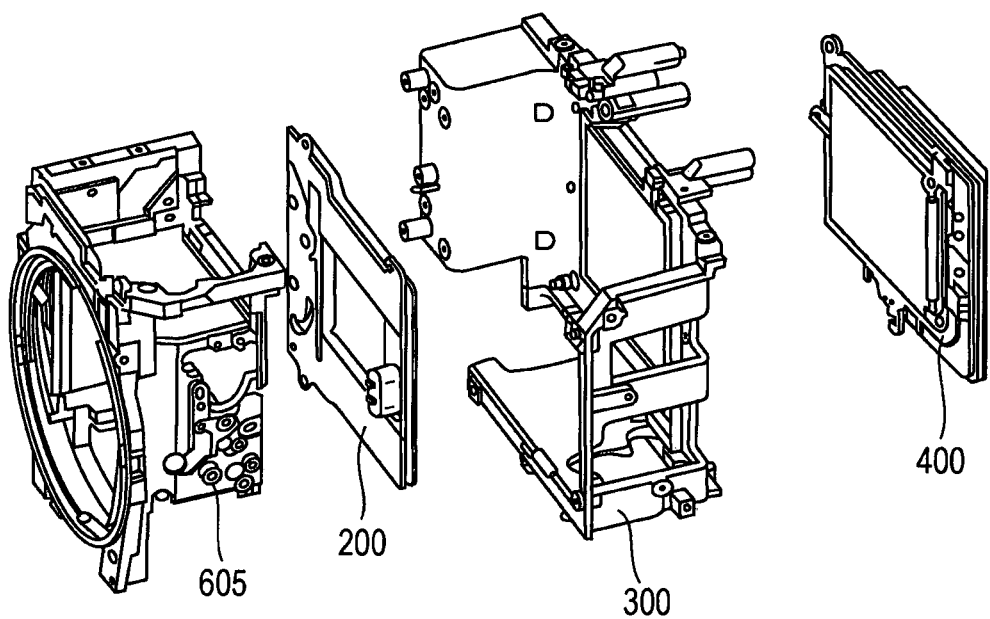
FIG. 13 is a schematic view of an image pickup apparatus according to an embodiment of the present invention.

An image pickup apparatus according to an embodiment of the present invention will be described below. An image pickup apparatus according to an embodiment of the present invention includes a dust removing device according to an embodiment of the present invention and an image pickup element unit, wherein the dust removing device includes a diaphragm on the light-receiving surface of the image pickup element unit. FIGS. 12 and 13 illustrate a digital single-lens reflex camera, which is an image pickup apparatus according to an embodiment of the present invention.

FIG. 12 is a front perspective view of the main body 601 of the camera viewed from the object side. An imaging lens unit has been removed. FIG. 13 is an exploded perspective view of the inside of the camera, illustrating surrounding structures of a dust removing device according to an embodiment of the present invention and an image pickup unit 400.

The main body 601 of the camera includes a mirror box 605 to which an image light beam passing through an imaging lens is directed. The mirror box 605 includes a main mirror (quick return mirror) 606. The main mirror 606 can make an angle of 45 degrees with the optical axis to direct an image light beam to a penta roof mirror (not shown) or may avoid the image light beam in order to direct the image light beam to an image pickup element (not shown).

The mirror box 605 and a shutter unit 200 are disposed in front of a main body chassis 300 of the main body 601 of the camera in this order from the object side. The image pickup unit 400 is disposed on the photographer side of the main body chassis 300. The image pickup unit 400 is installed such that an image pickup surface of the image pickup element is disposed at a predetermined distance from and parallel to the surface of a mount 602 to which an imaging lens unit is to be attached.

The image pickup unit 400 includes a vibrating component of a dust removing device and an image pickup element unit. The vibrating component of the dust removing device is disposed on the same axis as the light-receiving surface of the image pickup element unit.

Although the digital single-lens reflex camera has been described as an image pickup apparatus according to an embodiment of the present invention, the image pickup apparatus may be an interchangeable-lens camera, such as a mirrorless digital interchangeable-lens camera without the mirror box 605. Among various image pickup apparatuses and electrical and electronic equipment that include image pickup apparatuses, such as interchangeable-lens video cameras, copying machines, facsimile machines, and scanners, an image pickup apparatus according to an embodiment of the present invention can particularly be applied to devices that require the removal of dust deposited on a surface of an optical component.

(Electronic Equipment)

Electronic equipment according to an embodiment of the present invention will be described below. Electronic equipment according to an embodiment of the present invention includes a piezoelectric acoustic component that includes the piezoelectric element or the multilayered piezoelectric element described above. The piezoelectric acoustic component may be a loudspeaker, a buzzer, a microphone, or a surface acoustic wave (SAW) device.

Figure 14:
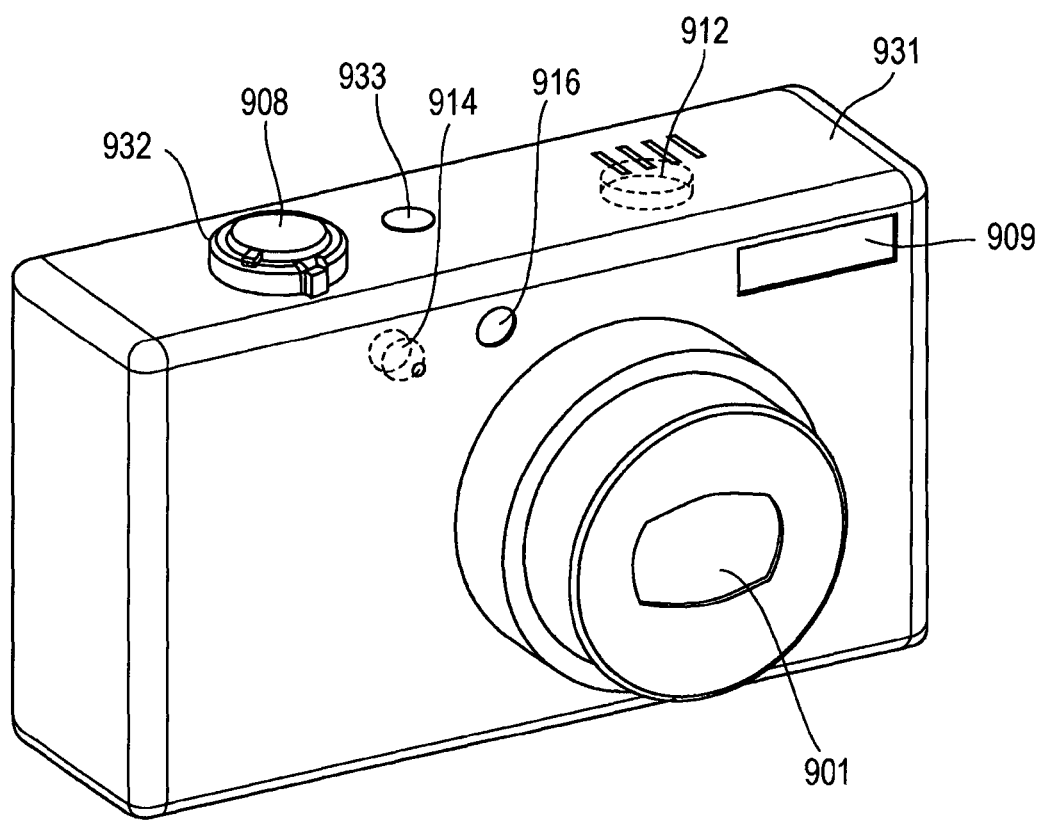
FIG. 14 is a schematic view of electronic equipment according to an embodiment of the present invention.

FIG. 14 is a front perspective view of the main body 931 of a digital camera, which is electronic equipment according to an embodiment of the present invention. An optical device 901, a microphone 914, an electronic flash unit 909, and a fill light unit 916 are disposed on the front surface of the main body 931. The microphone 914 is disposed within the main body and is indicated by a broken line. An opening for catching external sound is disposed in front of the microphone 914.

A power switch 933, a loudspeaker 912, a zoom lever 932, and a release button 908 for focusing are disposed on the top surface of the main body 931. The loudspeaker 912 is disposed within the main body 931 and is indicated by a broken line. An opening for transmitting sound to the outside is disposed in front of the loudspeaker 912.

The piezoelectric acoustic component may be used in at least one of the microphone 914, the loudspeaker 912, and a surface acoustic wave device.

Although the digital camera has been described as electronic equipment according to an embodiment of the present invention, the electronic equipment may also be applied to electronic equipment that includes a piezoelectric acoustic component, such as audio-reproducing devices, audio-recording devices, mobile phones, and information terminals.

As described above, a piezoelectric element and a multilayered piezoelectric element according to an embodiment of the present invention are suitable for liquid discharge heads, liquid discharge apparatuses, ultrasonic motors, optical apparatuses, vibratory apparatuses, dust removing devices, image pickup apparatuses, and electronic equipment. A liquid discharge head manufactured by using a piezoelectric element or a multilayered piezoelectric element according to an embodiment of the present invention can have a nozzle density and a discharge velocity higher than or equal to those of liquid discharge heads manufactured by using a lead-containing piezoelectric element.

A liquid discharge apparatus manufactured by using a liquid discharge head according to an embodiment of the present invention can have a discharge velocity and discharge accuracy higher than or equal to those of liquid discharge apparatuses manufactured by using a lead-containing piezoelectric element. An ultrasonic motor manufactured by using a piezoelectric element or a multilayered piezoelectric element according to an embodiment of the present invention can have driving force and durability higher than or equal to those of ultrasonic motors manufactured by using a lead-containing piezoelectric element.

An optical apparatus manufactured by using an ultrasonic motor according to an embodiment of the present invention can have durability and operation accuracy higher than or equal to those of optical apparatuses manufactured by using a lead-containing piezoelectric element.

A vibratory apparatus manufactured by using a piezoelectric element or a multilayered piezoelectric element according to an embodiment of the present invention can have vibratory capacity and durability higher than or equal to those of ultrasonic motors manufactured by using a lead-containing piezoelectric element.

A dust removing device manufactured by using a vibratory apparatus according to an embodiment of the present invention can have dust removal efficiency and durability higher than or equal to those of dust removing devices manufactured by using a lead-containing piezoelectric element.

An image pickup apparatus manufactured by using a dust removing device according to an embodiment of the present invention can have a dust removal function higher than or equal to those of image pickup apparatuses manufactured by using a lead-containing piezoelectric element.

A piezoelectric acoustic component that includes a piezoelectric element or a multilayered piezoelectric element according to an embodiment of the present invention can be used to provide electronic equipment that has sound production ability higher than or equal to those of electronic equipment manufactured by using a lead-containing piezoelectric element.

A piezoelectric material according to an embodiment of the present invention may be used in ultrasonic transducers, piezoelectric actuators, piezoelectric sensors, and ferroelectric memories, as well as liquid discharge heads and motors.

EXAMPLES

Although a piezoelectric material according to the present invention is more specifically described in the following examples, the present invention is not limited to these examples.

Examples 1 to 9 and Comparative Examples 1 to 4

Table 1 shows the compositions of sintered bodies according to Examples 1 to 9 and Comparative Examples 1 to 4 of the present invention. In the table, x denotes the amount of Na, y denotes the amount of Nb, z denotes the amount of Zn, v denotes the amount of Cu, and w denotes the amount of Mn. The composition changed by sintering was only the x/y ratio. The sintered bodies according to Examples 1 to 9 and Comparative Examples 1, 2, and 4 had an x/y ratio of 1 before sintering. The sintered body according to Comparative Example 3 had an x/y ratio of 1.03 before sintering.

TABLE 1

| Sample | x/y | x | y | z (mol %) | v (mol %) | w (mol %) |
|---|---|---|---|---|---|---|
| Example 1 | 0.97 | 0.85 | 0.88 | 0.5 | 0 | 0 |
| Example 2 | 0.97 | 0.85 | 0.88 | 1.0 | 0 | 0 |
| Example 3 | 0.97 | 0.85 | 0.88 | 2.0 | 0 | 0 |
| Example 4 | 0.98 | 0.86 | 0.88 | 1.0 | 0.2 | 0 |
| Example 5 | 0.96 | 0.84 | 0.88 | 1.0 | 0.5 | 0 |
| Example 6 | 0.97 | 0.85 | 0.88 | 1.0 | 0 | 0.2 |
| Example 7 | 0.97 | 0.85 | 0.88 | 1.0 | 0 | 0.5 |
| Example 8 | 0.97 | 0.87 | 0.90 | 1.0 | 0.5 | 0 |
| Example 9 | 0.97 | 0.82 | 0.85 | 1.0 | 0.5 | 0 |
| Comparative example 1 | 0.97 | 0.85 | 0.88 | 0 | 0 | 0 |
| Comparative example 2 | 0.97 | 0.85 | 0.88 | 6.0 | 0 | 0 |
| Comparative example 3 | 1.01 | 0.89 | 0.88 | 0 | 5.0 | 0 |
| Comparative example 4 | 0.97 | 0.85 | 0.88 | 0 | 0 | 5.0 |

The raw materials included powders of at least 99% pure sodium niobate ($NaNbO_3$), at least 99% pure barium titanate ($BaTiO_3$), 99.99% pure zinc oxide (Zn(II)O), 99.9% pure copper oxide (Cu(II)O), and 99.9% pure manganese oxide (Mn(IV)O2).

The raw materials were weighed such that the composition of the resulting piezoelectric material includes a perovskite-type metal oxide having the general formula (1): $(Na_xBa_{1-y})(Nb_yTi_{1-y})O_3$ (wherein $0.80 \leq x \leq 0.95$, and $0.85 \leq y \leq 0.95$), Zn ($0 < z \leq 5$ mol %), Cu ($0 \leq v \leq 1$ mol %), and Mn ($0 \leq w \leq 1$ mol %), as indicated by x, y, z, v, and w in Table 1. The raw powders were mixed in a ball mill for 12 hours.

More specifically, in Example 1, the raw materials were mixed such that the Zn (z) content corresponded to 0.5 mol % of a perovskite-type metal oxide having the general formula (1): $(Na_xBa_{1-y})(Nb_yTi_{1-y})O_3$ (x=0.85, y=0.88). The raw material of Zn was 99.99% pure ZnO. The Zn content of 0.5 mol % in Example 1 means that the weight of ZnO was 0.41 g (0.33 g of Zn) per mol of the perovskite-type metal oxide having the general formula (1) (172.2 g).

The mixed powder was calcined in the ambient atmosphere at a temperature in the range of 900° C. to 1000° C. for 2 to 5 hours. The calcined powder was pulverized and was granulated with a PVB binder. The weight of the PVB binder corresponded to 3% by weight of the calcined powder. The granulated powder was charged into a mold and was compressed at a pressure of 200 MPa to yield a compact having a diameter of 17 mm and a thickness of approximately 1 mm. The compact was fired in the air at a temperature in the range of 1100° C. to 1150° C. for 2 to 6 hours to yield a sintered body.

Among the samples according to the present invention, the density of the samples containing Zn was higher than the density of the samples having the same composition but not containing Zn. The addition of Zn reduced the calcination and sintering temperatures by 50° C. to 100° C.

The sintered body was polished to a thickness of approximately 0.5 mm. The constituent phase and the lattice constant of the polished sintered body or a powder of the polished sintered body were determined by X-ray diffraction. The X-ray diffraction showed that the samples were substantially composed of a single phase of the perovskite structure.

The composition of the sintered body of the piezoelectric material was analyzed by inductively coupled plasma emission spectroscopy (ICP). Table 1 shows the results for the general formula (1) (x, y, x/y), Zn (z), Cu (v), and Mn (w). In all the samples other than Comparative Example 3, the ratio (Na/Nb, x/y) of the number of moles of Na (x) to the number of moles of Nb (y) ranged from 96% to 99%, and the samples were deficient in Na.

The grain size of the sintered body was determined through observation with an optical microscope or an electron microscope. The sintered body had an average grain size in the range of 2 to 100 μm as measured with an electron microscope.

The distribution of Zn in the sintered body was examined by energy dispersive X-ray spectroscopy. Zn was present at grain boundaries in Example 3.

In order to examine electrical characteristics, such as piezoelectric property and insulation resistance, piezoelectric elements according to Examples 1 to 9 were manufactured. First, in order to relieve stress in the polished sintered body and remove organic components on the surface of the polished sintered body, the polished sintered body was heat-treated in the air at a temperature in the range of 400° C. to 500° C. for 30 minutes. A gold electrode having a thickness of 400 nm was formed on the front and back sides of a discoidal ceramic by DC sputtering. A titanium film having a thickness of 30 nm was formed as an adhesion layer between the electrode and the ceramic. The ceramic having the electrodes was cut into a 10 mm×2.5 mm×0.5 mm plate-like piezoelectric element.

Resistivity was measured with a semiconductor parameter analyzer. A direct-current voltage of several tens to a hundred volts was applied to a sample, and the electrical resistance was measured 30 seconds after the start of voltage application. Resistivity was calculated from the measured electrical resistance and the dimensions of the sample. When the resistivity is 30 GΩ·cm or more, preferably 100 GΩ·cm or more, the piezoelectric material and the piezoelectric element have a satisfactory practical insulation property.

An electric field-polarization hysteresis was measured to determine whether the target element is ferroelectric in a practical electric field at room temperature. A material that is ferroelectric in a certain temperature range has piezoelectricity in that temperature range and can also be used as a memory material. More specifically, the polarization of a piezoelectric element according to an embodiment of the present invention was measured while an alternating electric field (triangular wave) was applied to the piezoelectric element. The frequency of the alternating electric field ranged from 10 to 100 Hz. The electric field intensity was ±45 kV/cm or less.

Polarization treatment was performed before the evaluation of piezoelectric property. More specifically, a voltage in the range of 1.5 to 5 kV/mm was applied to a sample in an oil bath at a temperature in the range of 110° C. to 150° C. for 30 minutes, and the sample was cooled to room temperature while the voltage was maintained. Comparative Examples 2 to 4 had an insulation resistivity as low as $10^6$ Ω·cm or less and could not be subjected to polarization treatment.

The Young's modulus ($Y_{11}$), electromechanical coupling coefficient ($k_{31}$), piezoelectric constant ($d_{31}$), and mechanical quality factor (Qm) of the plate-like piezoelectric element were measured using a resonance-antiresonance method. The piezoelectric constant ($d_{33}$) of the sample was measured with a Berlincourt $d_{33}$ meter. The relative dielectric constant was measured with an impedance analyzer. The relative dielectric constant in the present specification was measured at a frequency of 1 kHz and at an alternating electric field voltage of 500 mV. Measurement was performed after polarization treatment. The temperature dependence of the relative dielectric constant was measured from room temperature. The change in relative dielectric constant was measured while a sample was cooled from room temperature to −100° C. and was then heated to 350° C. The Curie temperature and the successive phase transition temperature were calculated from the maximum relative dielectric constant.

Tables 2 and 3 show the measurement results for the samples according to Examples 1 to 9 and Comparative Example 1.

TABLE 2

| Sample | Curie temperature (° C.) | Relative dielectric constant | Electromechanical coupling coefficient $k_{31}$ | Piezoelectric constant $|d_{31}|$ (pm/V) | Young's modulus $Y_{11}$ (GPa) | Piezoelectric constant $|d_{33}|$ (pC/N) |
|---|---|---|---|---|---|---|
| Example 1 | 195 | 1194 | 0.16 | 46.6 | 124 | 128 |
| Example 2 | 195 | 1273 | 0.16 | 47.7 | 125 | 131 |
| Example 3 | 195 | 1287 | 0.16 | 46.9 | 124 | 119 |
| Example 4 | 193 | 877 | 0.15 | 42.0 | 103 | 140 |
| Example 5 | 193 | 702 | 0.09 | 28.1 | 60 | 133 |
| Example 6 | 190 | 1110 | 0.20 | 55.8 | 132 | 160 |
| Example 7 | 185 | 1093 | 0.20 | 55.4 | 132 | 163 |
| Example 8 | 140 | 870 | 0.13 | 39.9 | 76 | 150 |
| Example 9 | 200 | 691 | 0.09 | 25.8 | 71 | 116 |
| Comparative example 1 | 200 | 587 | 0.07 | 18.8 | 65 | 103 |

TABLE 3

| Sample | Resistivity [GΩ · cm] |
|---|---|
| Example 4 | 251 |
| Example 5 | 42 |
| Example 6 | 3561 |
| Example 7 | 4029 |
| Example 8 | 69.7 |
| Example 9 | 439 |
| Comparative example 1 | 1.1 |

(Evaluation of Piezoelectric Materials and Piezoelectric Elements According to Examples 1 to 3 and Comparative Examples 1 and 2)

In Examples 1 to 3, Zn was added to the samples in an amount that corresponded to 0.5 to 2 mol % of the amount of the perovskite-type metal oxide having the general formula (1). The addition of Zn increased the electromechanical coupling coefficient and the piezoelectric constants $d_{31}$ and $d_{33}$. The addition of Zn also increased the Young's modulus.

The addition of more than 5 mol % ZnO as in Comparative Example 2 resulted in no formation of the perovskite-type metal oxide and a very low resistivity. Thus, the piezoelectric property of the sample could not be measured.

The addition of Zn increased polarization as determined by an electric field-polarization hysteresis.

(Evaluation of Piezoelectric Materials and Piezoelectric Elements According to Examples 4, 5, 8, and 9 and Comparative Example 3

In Examples 4 and 5, Zn and Cu were added to the samples. The amount of Zn corresponded to 1 mol % of the amount of the perovskite-type metal oxide having the general formula (1). The amount of Cu corresponded to 0.2 or 0.5 mol % of the amount of the perovskite-type metal oxide. The addition of Cu increased the electric resistivity.

The addition of 5 mol % Cu as in Comparative Example 3 resulted in no formation of the perovskite-type metal oxide. Thus, the piezoelectric property of the sample could not be measured.

(Evaluation of Piezoelectric Materials and Piezoelectric Elements According to Examples 6 and 7 and Comparative Example 4)

In Examples 6 and 7, Zn and Mn were added to the samples. The amount of Zn corresponded to 1 mol % of the amount of the perovskite-type metal oxide having the general formula (1). The amount of Mn corresponded to 0.2 or 0.5 mol % of the amount of the perovskite-type metal oxide. The addition of Mn increased the resistivity, piezoelectric constant, electromechanical coupling coefficient, Young's modulus, and density and decreased tan δ.

The addition of 5 mol % Mn as in Comparative Example 4 resulted in no formation of the perovskite-type metal oxide and a very low resistivity. Thus, the piezoelectric property of the sample could not be measured.

Figure 15:
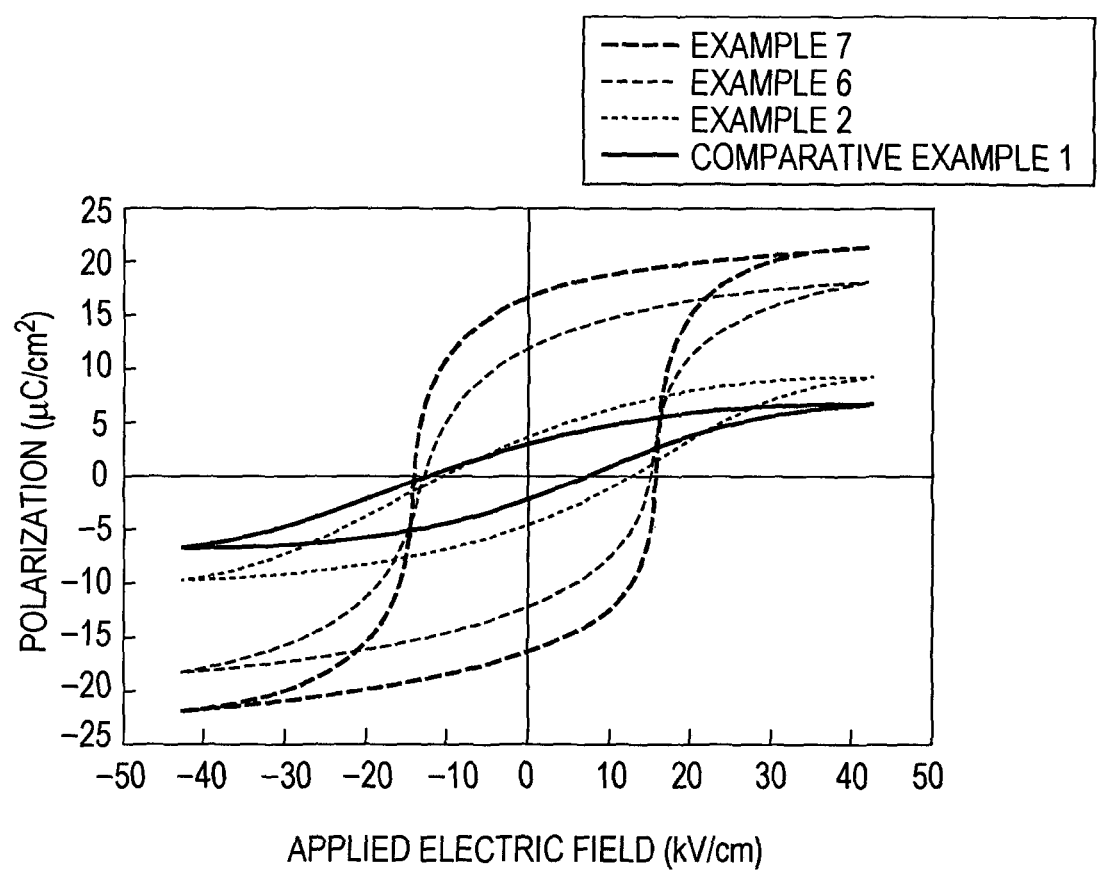
FIG. 15 is a graph of polarization-electric field hysteresis loops of sintered bodies according to Comparative Example 1 and Examples 2, 6, and 7 of the present invention.

FIG. 15 shows electric field-polarization hysteresis curves for Comparative Example 1 and Examples 2, 6, and 7. The addition of Zn increased polarization in a certain electric field as compared with Comparative Example.

Example 10

The raw materials corresponding to Example 2 were weighed as described below. Sodium niobate, barium titanate, zinc (II) oxide powders were weighed such that the Na, Nb, Ti, Ba, and Zn contents were the same as those of the composition according to Example 2 in Table 1. The raw powders were mixed in a ball mill overnight.

The mixed powder was mixed with PVB and was formed into a green sheet having a thickness of 50 μm using a doctor blade method.

An electrically conductive paste for an internal electrode was applied to the green sheet. The electrically conductive paste was a Ag 70%-Pd 30% alloy (Ag/Pd=2.33) paste. Nine of the green sheets to which the electrically conductive paste had been applied were stacked and were fired at 1150° C. for 5 hours to yield a sintered body. The sintered body was cut into a 10 mm×2.5 mm piece. The side surfaces of the piece were polished. A pair of external electrodes (a first electrode and a second electrode) for alternately connecting internal electrodes were formed by Au sputtering. Thus, a multilayered piezoelectric element as illustrated in FIG. 2B was manufactured.

The observation of the internal electrodes of the multilayered piezoelectric element showed that the electrode material Ag—Pd and the piezoelectric material were alternately stacked on top of one another.

Before the evaluation of piezoelectricity, a sample was subjected to polarization treatment. More specifically, the sample was heated to a temperature in the range of 130° C. to 150° C. in an oil bath. A voltage of 1.5 kV/cm was applied between the first electrode and the second electrode for 30 minutes, and the sample was cooled to room temperature while the voltage was maintained.

The evaluation of the piezoelectricity of the multilayered piezoelectric element showed that the multilayered piezoelectric element had a satisfactory insulation property and had a satisfactory piezoelectric property similar to the piezoelectric material according to Example 2.

Example 11

Sodium niobate, barium titanate, zinc oxide powders were weighed such that the Na, Nb, Ti, Ba, and Zn contents were the same as those of the composition according to Example 3 in Table 1. The raw powders were mixed in a ball mill overnight. The weighed powders were mixed with 3 parts by weight of a PVB binder. This mixed powder was formed into a green sheet having a thickness of 50 μm using a doctor blade method.

An electrically conductive paste for an internal electrode was applied to the green sheet. The electrically conductive paste was a Ni paste. Nine of the green sheets to which the electrically conductive paste had been applied were stacked and were heat-pressed.

The heat-pressed layered body was fired in a tubular furnace. The heat-pressed layered body was fired to a temperature up to 300° C. in the ambient atmosphere to remove the binder and was then held at 1150° C. for 5 hours in a reducing atmosphere ($H_2:N_2=2:98$, an oxygen concentration of $2\times10^{-6}$ Pa). During cooling to room temperature, the oxygen concentration was increased to 30 Pa at a temperature of 1000° C. or less.

The resulting sintered body was cut into a 10 mm×2.5 mm piece. The side surfaces of the piece were polished. A pair of external electrodes (a first electrode and a second electrode) for alternately connecting internal electrodes were formed by Au sputtering. Thus, a multilayered piezoelectric element as illustrated in FIG. 2B was manufactured.

The observation of the internal electrodes of the multilayered piezoelectric element showed that the electrode material Ni and piezoelectric material layers were alternately stacked on top of one another. An electric field of 2 kV/mm was applied to the multilayered piezoelectric element in an oil bath at a temperature in the range of 110° C. to 150° C. for 30 minutes for polarization treatment.

The evaluation of the piezoelectric property of the multilayered piezoelectric element showed that the multilayered piezoelectric element had a satisfactory insulation property and had a satisfactory piezoelectric property similar to the piezoelectric element according to Example 3.

Example 12

A liquid discharge head illustrated in FIGS. 3A and 3B was manufactured using a piezoelectric element according to Example 6. An ink was discharged in response to the input of an electric signal.

Example 13

A liquid discharge apparatus illustrated in FIG. 4 was manufactured using the liquid discharge head according to Example 12. An ink was discharged onto a recording medium in response to the input of an electric signal.

Example 14

An ultrasonic motor illustrated in FIG. 6A was manufactured using the piezoelectric element according to Example 6. The motor rotated upon the application of an alternating voltage.

Example 15

An optical apparatus illustrated in FIGS. 7A and 7B was manufactured using the ultrasonic motor according to Example 14. Automatic focusing was observed upon the application of an alternating voltage.

Example 16

A dust removing device illustrated in FIGS. 9A and 9B was manufactured using the piezoelectric element according to Example 6. Satisfactory dust removing efficiency was observed upon the application of an alternating voltage after plastic beads were scattered.

Example 17

An image pickup apparatus illustrated in FIG. 12 was manufactured using the dust removing device according to Example 16. Dust on the surface of the image pickup unit was satisfactorily removed, and images free of dust defects were obtained.

Example 18

A liquid discharge head illustrated in FIGS. 3A and 3B was manufactured using each of the multilayered piezoelectric elements according to Examples 10 and 11. An ink was discharged in response to the input of an electric signal.

Example 19

A liquid discharge apparatus illustrated in FIG. 4 was manufactured using the liquid discharge head according to Example 18. An ink was discharged onto a recording medium in response to the input of an electric signal.

Example 20

An ultrasonic motors illustrated in FIG. 6B was manufactured using each of the multilayered piezoelectric elements according to Examples 10 and 11. The motors rotated upon the application of an alternating voltage.

Example 21

An optical apparatus illustrated in FIGS. 7A and 7B was manufactured using each of the ultrasonic motors according to Example 20. Automatic focusing was observed upon the application of an alternating voltage.

Example 22

A dust removing device illustrated in FIGS. 9A and 9B was manufactured using each of the multilayered piezoelectric elements according to Examples 10 and 11. Satisfactory dust removing efficiency was observed upon the application of an alternating voltage after plastic beads were scattered.

Example 23

An image pickup apparatus illustrated in FIG. 12 was manufactured using the dust removing device according to Example 22. Dust on the surface of the image pickup unit was satisfactorily removed, and images free of dust defects were obtained.

Example 24

Electronic equipment illustrated in FIG. 14 was manufactured using each of the multilayered piezoelectric elements according to Examples 10 and 11. A loudspeaker operated upon the application of an alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-014614, filed Jan. 29, 2013, which is hereby incorporated by reference herein in its entirety.

INDUSTRIAL APPLICABILITY

A piezoelectric material according to an embodiment of the present invention has satisfactory piezoelectricity even at high environmental temperatures. The piezoelectric material contains no lead and can reduce the load on the environment. Thus, a piezoelectric material according to an embodiment of the present invention can also be used without problems for apparatuses manufactured using a large amount of piezoelectric material, such as liquid discharge heads, ultrasonic motors, and dust removing devices.

REFERENCE SIGNS LIST 1 first electrode
2 piezoelectric material
3 second electrode
101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 oscillator
202 rotor
203 output shaft
204 oscillator
205 rotor
206 spring
2011 elastic ring
2012 piezoelectric element
2013 organic adhesive
2041 metal elastic body
2042 multilayered piezoelectric element
310 dust removing device
320 diaphragm
330 piezoelectric element
331 piezoelectric material
332 first electrode
333 second electrode
336 first electrode surface
337 second electrode surface
51 first electrode
53 second electrode
54 piezoelectric material layer
55 internal electrode
56 layered body
501 first electrode
503 second electrode
504 piezoelectric material layer 505a internal electrode
505b internal electrode
506a external electrode
506b external electrode
601 main body of camera
602 mount
605 mirror box
606 main mirror
200 shutter unit
300 main body chassis
400 image pickup unit
701 front lens group
702 rear lens group (focus lens)
711 removable mount
712 fixed barrel
713 linear guide barrel
714 front lens group barrel
715 cam ring
716 rear lens group barrel
717 cam roller
718 screw
719 roller
720 rotation transmitting ring
722 driven roller
724 manual focus ring
725 ultrasonic motor
726 wave washer
727 ball race
728 focus key
729 joint
732 washer
733 low-friction sheet
881 liquid discharge apparatus
882 exterior
883 exterior
884 exterior
885 exterior
887 exterior
890 recovering section
891 recording portion
892 carriage
896 main body of apparatus
897 automatic feeder
898 outlet
899 conveying unit
901 optical device
908 release button
909 electronic flash unit
912 loudspeaker
914 microphone
916 fill light unit
931 main body
932 zoom lever
933 power switch

The invention claimed is:

1. A piezoelectric material, comprising: a perovskite-type metal oxide having the following general formula (1); and Zn, wherein a content of the Zn corresponds to more than 0.1 mol % and 2 mol % or less of the amount of the perovskite-type metal oxide:

(Na$_x$Ba$_{1-y}$)(Nb$_y$Ti$_{1-y}$)O$_3$     (1)

wherein x satisfies $0.80 \leq x \leq 0.95$, and y satisfies $0.85 \leq y \leq 0.95$.

2. The piezoelectric material according to claim 1, further comprising at least one element selected from Cu and Mn, wherein the amount of the at least one element selected from Cu and Mn corresponds to more than 0 mol % and 1 mol % or less of the amount of the perovskite-type metal oxide.

3. The piezoelectric material according to claim 1, wherein x is smaller than y in the general formula (1).

4. A piezoelectric element, comprising: a first electrode; a piezoelectric material portion; and a second electrode, wherein the piezoelectric material portion includes the piezoelectric material according to claim 1.

5. A liquid discharge head, comprising: a liquid chamber; and a discharge port in communication with the liquid chamber, wherein the liquid chamber includes a vibrating portion that includes the piezoelectric element according to claim 4.

6. A liquid discharge apparatus, comprising: a stage configured to receive an object; and the liquid discharge head according to claim 5.

7. An ultrasonic motor, comprising: a vibrating member that includes the piezoelectric element according to claim 4; and a moving body in contact with the vibrating member.

8. An optical apparatus, comprising a drive unit that includes the ultrasonic motor according to claim 7.

9. A vibratory apparatus, comprising a vibrating member that includes the piezoelectric element according to claim 4 on a diaphragm.

10. A dust removing device, comprising a vibrating portion including the vibratory apparatus according to claim 9.

11. An image pickup apparatus, comprising: the dust removing device according to claim 10; and an image pickup element unit, wherein the diaphragm of the dust removing device is disposed on the light-receiving surface side of the image pickup element unit.

12. Electronic equipment, comprising a piezoelectric acoustic component that includes the piezoelectric element according to claim 4.

13. A multilayered piezoelectric element, comprising: piezoelectric material layers and electrode layers alternately stacked on top of one another, the electrode layers including an internal electrode, wherein the piezoelectric material layers contain the piezoelectric material according to claim 1.

14. The multilayered piezoelectric element according to claim 13, wherein the internal electrode contains Ag and Pd, and the weight ratio M1/M2 of the weight M1 of Ag to the weight M2 of Pd is in the range of $1.5 \leq M1/M2 \leq 9.0$.

15. The multilayered piezoelectric element according to claim 13, wherein the internal electrode contains at least one of Ni and Cu.

16. A liquid discharge head, comprising: a liquid chamber; and a discharge port in communication with the liquid chamber, wherein the liquid chamber includes a vibrating portion that includes the multilayered piezoelectric element according claim 13.

17. A liquid discharge apparatus comprising a stage configured to receive an object and the liquid discharge head according to claim 16.

18. An ultrasonic motor comprising a vibrating member that includes the multilayered piezoelectric element according to claim 13 and a moving body in contact with the vibrating member.

19. An optical apparatus comprising a drive unit that includes the ultrasonic motor according to claim 18.

20. A vibratory apparatus comprising a vibrating member that includes the multilayered piezoelectric element according to claim 13 on a diaphragm.

21. A dust removing device, comprising a vibrating portion including the vibratory apparatus according to claim 20.

22. An image pickup apparatus, comprising the dust removing device according to claim 21 and an image pickup element unit, wherein the diaphragm of the dust removing device is disposed on the light-receiving surface side of the image pickup element unit.

23. Electronic equipment comprising a piezoelectric acoustic component that includes the multilayered piezoelectric element according to claim 13.

* * * * *